(12) United States Patent
Fujita

(10) Patent No.: US 9,443,790 B2
(45) Date of Patent: *Sep. 13, 2016

(54) SEMICONDUCTOR DEVICE

(71) Applicant: PS4 LUXCO S.A.R.L., Luxembourg (LU)

(72) Inventor: Osamu Fujita, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/161,248

(22) Filed: Jan. 22, 2014

(65) Prior Publication Data

US 2014/0217560 A1    Aug. 7, 2014

Related U.S. Application Data

(63) Continuation of application No. 13/226,541, filed on Sep. 7, 2011, now Pat. No. 8,659,152.

(30) Foreign Application Priority Data

Sep. 15, 2010 (JP) ................................ 2010-206858

(51) Int. Cl.
  *H01L 23/48* (2006.01)
  *H01L 23/538* (2006.01)
  (Continued)

(52) U.S. Cl.
  CPC ....... *H01L 23/481* (2013.01); *H01L 21/30655* (2013.01); *H01L 21/76898* (2013.01); *H01L 21/823481* (2013.01); *H01L 23/5384* (2013.01); *H01L 24/81* (2013.01); *H01L 25/0657* (2013.01); *H01L 25/50* (2013.01); *H01L 27/0617* (2013.01); *H01L 24/11* (2013.01); *H01L 24/13* (2013.01); *H01L 24/14* (2013.01); *H01L 24/16* (2013.01); *H01L 2224/0401* (2013.01); *H01L 2224/05166* (2013.01); *H01L 2224/05572* (2013.01); *H01L 2224/05647* (2013.01); *H01L 2224/11462* (2013.01); *H01L 2224/13009* (2013.01); *H01L 2224/13082* (2013.01); *H01L 2224/13111* (2013.01); *H01L 2224/13147* (2013.01); *H01L 2224/14181* (2013.01);
  (Continued)

(58) Field of Classification Search
  CPC ................... H01L 2224/16146; H01L 23/485
  See application file for complete search history.

(56) References Cited

U.S. PATENT DOCUMENTS 7,646,079 B2    1/2010 Umemoto
2008/0272466 A1  11/2008 Lake
(Continued)

FOREIGN PATENT DOCUMENTS

JP    2005101268 A    4/2005
JP    2007-311584     11/2007
(Continued)

*Primary Examiner* — Caleb Henry
*Assistant Examiner* — Mounir Amer
(74) *Attorney, Agent, or Firm* — Stoel Rives LLP

(57) ABSTRACT

A semiconductor device includes a semiconductor substrate having a first surface, a through silicon via (TSV) that is formed so that at least a part thereof penetrates through the semiconductor substrate, and an insulation ring. The insulation ring is formed so as to penetrate through the semiconductor substrate and so as to surround the TSV. The insulation ring includes a tapered portion and a vertical portion. The tapered portion has a sectional area which is gradually decreased from the first surface toward a thickness direction of the semiconductor substrate. The vertical portion has a constant sectional area smaller than the tapered portion.

17 Claims, 25 Drawing Sheets

(51) Int. Cl.
*H01L 21/3065* (2006.01)
*H01L 21/768* (2006.01)
*H01L 21/8234* (2006.01)
*H01L 25/065* (2006.01)
*H01L 25/00* (2006.01)
*H01L 27/06* (2006.01)
*H01L 23/00* (2006.01)

(52) U.S. Cl.
CPC ............... *H01L2224/16146* (2013.01); *H01L 2224/16225* (2013.01); *H01L 2224/16227* (2013.01); *H01L 2224/16245* (2013.01); *H01L 2224/81095* (2013.01); *H01L 2224/81193* (2013.01); *H01L 2224/81203* (2013.01); *H01L 2224/81907* (2013.01); *H01L 2225/06513* (2013.01); *H01L 2225/06517* (2013.01); *H01L 2225/06544* (2013.01); *H01L 2924/00014* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01019* (2013.01); *H01L 2924/01023* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/01082* (2013.01); *H01L 2924/13091* (2013.01); *H01L 2924/1436* (2013.01); *H01L 2924/1437* (2013.01); *H01L 2924/1438* (2013.01); *H01L 2924/1461* (2013.01); *H01L 2924/14335* (2013.01)

(56) References Cited

U.S. PATENT DOCUMENTS

| | | | |
|---|---|---|---|
| 2008/0290445 A1* | 11/2008 | Knaipp et al. | 257/506 |
| 2009/0243120 A1 | 10/2009 | Kita et al. | |
| 2010/0032764 A1 | 2/2010 | Andry et al. | |
| 2010/0171223 A1 | 7/2010 | Kuo et al. | |
| 2011/0316168 A1* | 12/2011 | Moon et al. | 257/774 |

FOREIGN PATENT DOCUMENTS

| | | |
|---|---|---|
| JP | 2008251964 A | 10/2008 |
| JP | 2009-044031 | 2/2009 |
| JP | 2009-260284 | 11/2009 |
| JP | 2010157741 A | 7/2010 |

* cited by examiner

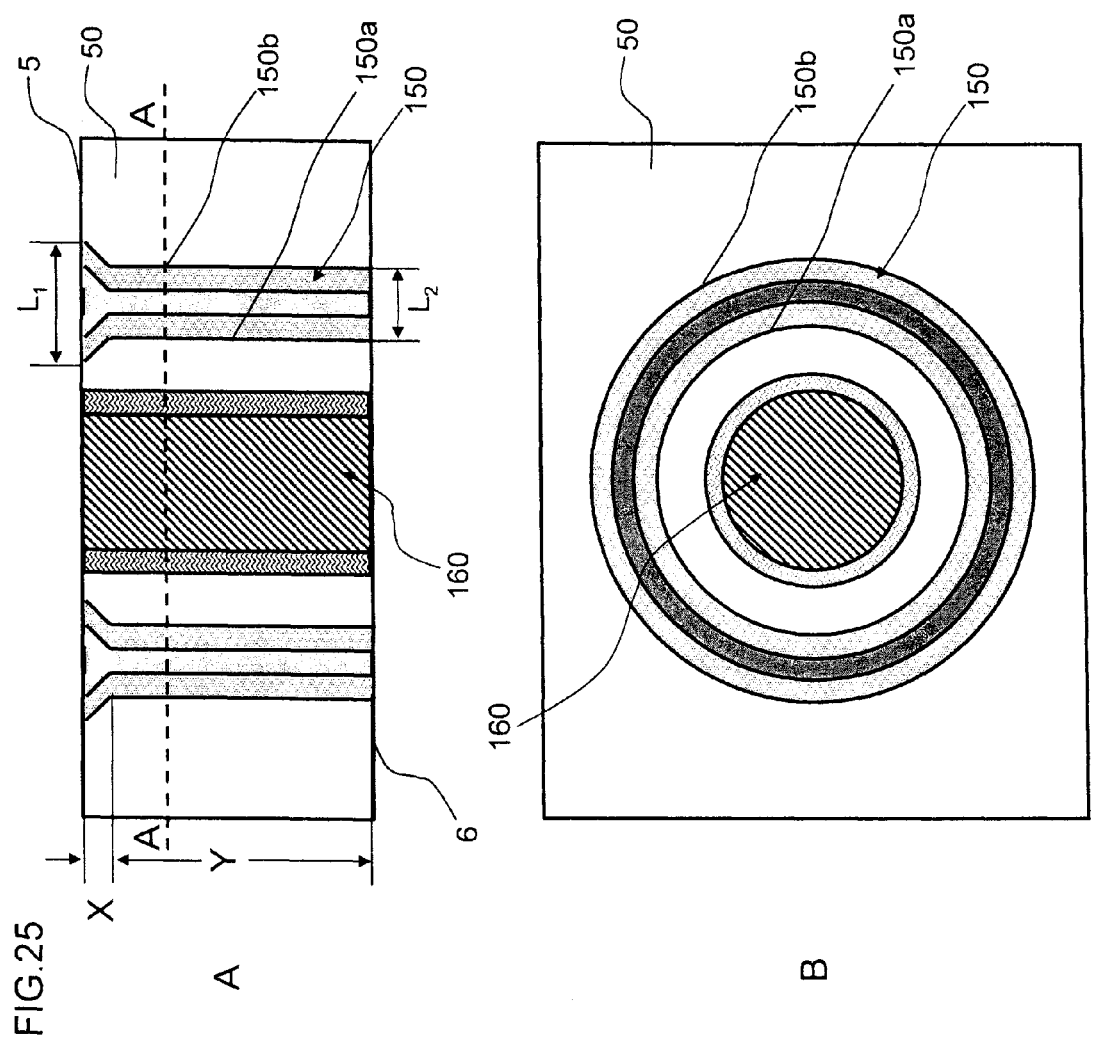

SEMICONDUCTOR DEVICE

CROSS REFERENCE TO RELATED APPLICATIONS

This application is a continuation of application Ser. No. 13/226,541 filed on Sep. 7, 2011, which claims the benefit of priority from Japanese Patent Application No. 2010-206858, filed on Sep. 15, 2010, the disclosures of which are incorporated herein in its entirety by reference.

TECHNICAL FIELD

The invention relates to a semiconductor device.

BACKGROUND ART

When manufacturing a semiconductor device, a process of forming an opening (via hole) has been used in many cases. As disclosed in JP 2007-311584A and JP 2009-044031A, a Bosch process has been known as a means for forming a deep opening having a vertical shape in a semiconductor substrate such as silicon. The Bosch process is a technology that repeats an etching process of isotropically etching a surface of the semiconductor substrate to form an opening and a deposition process of depositing a carbon polymer-based protective film on an inner wall of the opening alternately, thereby etching the semiconductor substrate vertically and deeply.

FIG. 21 is a sectional view of an opening 31 that is formed in a semiconductor substrate 30 by the Bosch process according to the related art. In the Bosch process, since the etching process and the deposition process are repeated, it is known that a sectional shape of a waveform referred to as scalloping (which is indicated with 'S') is formed on side surface of the opening.

FIG. 22 shows an opening forming method using the Bosch process according to the related art. A mask 32 having an opening pattern is formed on the semiconductor substrate 30 with a photoresist film and the like.

As shown in FIG. 22A, in a first cycle, a first opening 31-1 is formed by dry etching having high isotropy and using etching gas (first etching process).

As shown in FIG. 22B, a protective film 33 that covers an inner wall of the first opening 31-1 and a top surface of the mask 32 is deposited by using deposition gas (deposition process).

As shown in FIG. 22C, the dry etching in which the anisotropy is increased by using the etching gas is performed to remove the protective film on a bottom of the first opening 31-1 (second etching process). The protective film 33a remains on side surface of the first opening 31-1.

As shown in FIG. 22D, in a second cycle, a second opening 31-2 is formed by the isotropic dry etching (first etching process). When performing the etching, a part of the protective film 33a is also removed.

By repeating the series of cycles more than once (for example, 200 times), the opening 31 having the substantially vertical shape and a predetermined depth as shown in FIG. 21 is formed.

SUMMARY OF THE INVENTION

In one embodiment, there is provided a semiconductor device, comprising:
a semiconductor substrate including a first surface;
a through silicon via, at least part of the through silicon via penetrating through the semiconductor substrate; and
an insulation ring penetrating through the semiconductor substrate and surrounding the through silicon via, the insulation ring comprising a tapered portion with a sectional area decreased gradually from the first surface toward a thickness direction of the semiconductor substrate and a vertical portion with a constant sectional area smaller than the sectional area of the tapered portion.

In another embodiment, there is provided a semiconductor device, comprising:
a semiconductor substrate including a first surface;
a through silicon via, at least part of the through silicon via penetrating through the semiconductor substrate; and
an insulation ring penetrating through the semiconductor substrate and surrounding the through silicon via, the insulation ring comprising a tapered portion and a vertical portion,
wherein the tapered portion and the vertical portion include an inner side surface and an outer side surface surrounding the through silicon via,
in the tapered portion, a length between the inner side surface and outer side surface is gradually decreased from the first surface toward a thickness direction of the semiconductor substrate, and
in the vertical portion, a length between the inner side surface and outer side surface is constant smaller than the length between the inner side surface and outer side surface in the tapered portion.

In another embodiment, there is provided a semiconductor device, comprising:
a semiconductor substrate having a first surface and a second surface opposite to the first surface;
an insulating ring formed in the semiconductor substrate to penetrate through the semiconductor substrate from the first surface to the second surface;
a first interlayer insulating film formed over the first surface of the semiconductor substrate to cover the insulating ring;
a transistor formed on the first surface of the semiconductor substrate;
an insulating layer formed on the second surface of the semiconductor substrate to cover the insulating ring;
a through silicon via (TSV) formed in the semiconductor substrate to penetrate through the insulating layer, the semiconductor substrate, and the first interlayer insulating film inside of the insulating ring;
a first wiring formed on the first interlayer insulating film to connect to the TSV;
a second interlayer insulating film formed over the first interlayer insulating film to cover the first wiring;
a contact plug formed in the second interlayer insulating film to penetrate through the second interlayer insulating film;
a first bump formed on the TSV; and
a second bump formed on the second interlayer insulating film to connect to the contact plug,
wherein the insulating ring includes a tapered portion in contact with the first surface of the semiconductor substrate, and a vertical portion in contact with the second surface of the semiconductor substrate,
wherein each of the tapered portion and the vertical portion includes a surface to define a boundary with the semiconductor substrate,
wherein the surface of the tapered portion comprises a first convex arc and a second convex arc connected in series, the first convex arc is placed closer to the first surface of the semiconductor substrate compared with the second convex arc, and the first convex arc is larger than the second convex arc, and wherein the surface of the vertical portion comprises a plurality of third convex arcs connected in series, the third convex arcs are smaller than the first convex arc and the second convex arc, and each of the third convex arcs is substantially identical to each other.

BRIEF DESCRIPTION OF THE DRAWINGS

The above features and advantages of the present invention will be more apparent from the following description of certain preferred embodiments taken in conjunction with the accompanying drawings, in which:

FIGS. 25A and 25B illustrate the semiconductor device of the first exemplary embodiment.

Figure 1:
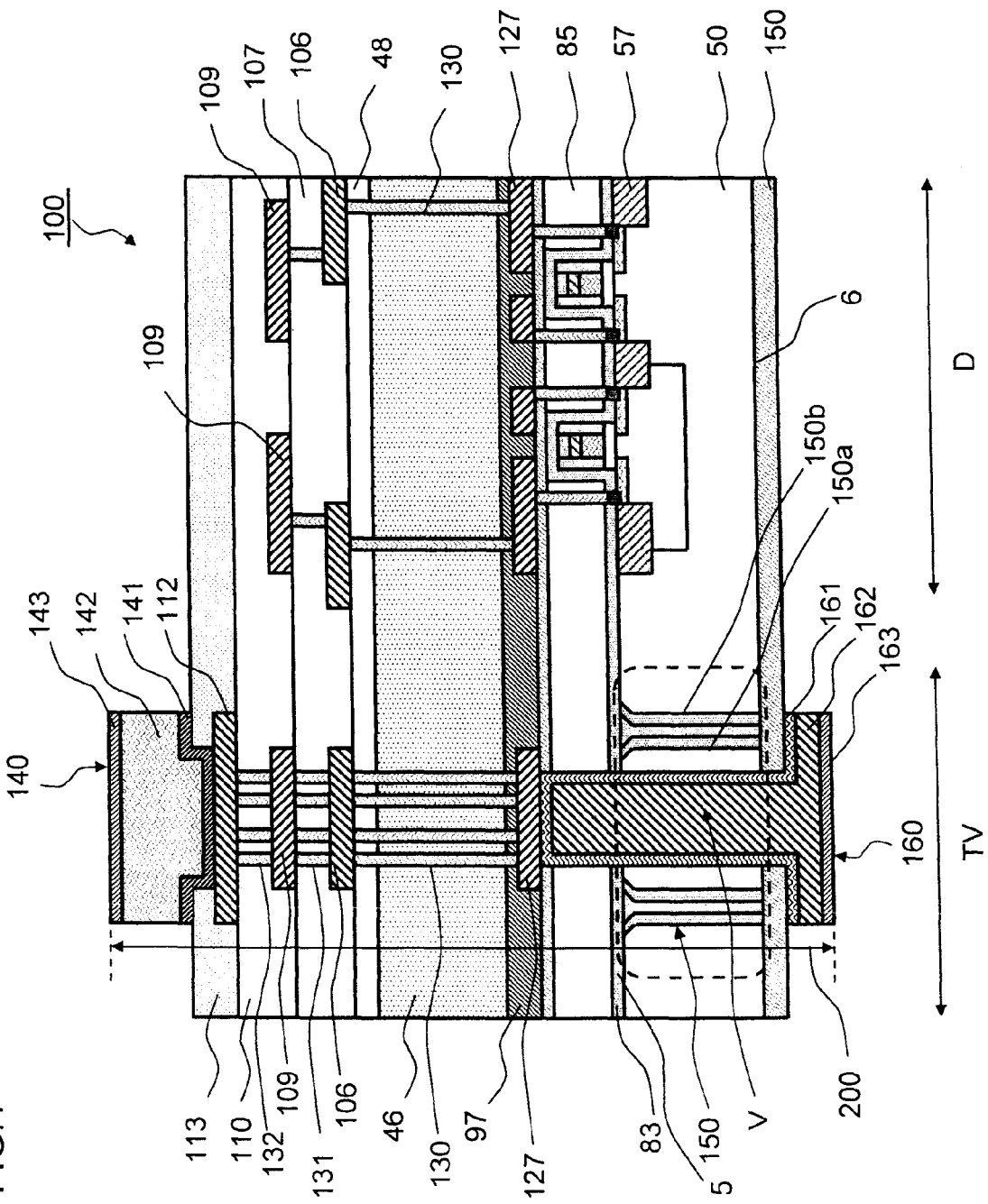
FIG. 1 shows a semiconductor device of a first exemplary embodiment.

In the drawings, reference numerals have the following meanings: 1: semiconductor substrate, 2: mask pattern, 3-1, 3-2, 3-3, 3-10: opening, 4, 4a: protective film, 5: first surface, 6: second surface, 10: insulation film, 11: thickness direction, 22, 31, 31-1, 31-2: opening, 30: semiconductor substrate, 32: mask pattern, 33, 33a: protective film, 35: insulation film, 36: void, 50: semiconductor substrate, 51: gate insulation film, 57: isolation region, 83: liner, 85, 86, 98, 105, 107, 110: interlayer insulation film, 93: metal film, 100: semiconductor chip, 106, 109, 112: wiring, 111: silicon nitride film, 113: protective film, 114: N-type well, 120: P-type impurity diffusion layer, 121: N-type impurity diffusion layer, 124, 126: peripheral contact hole, 125: silicide layer, 127: local wiring, 130, 131, 132: contact plug, 140: topside bump, 141: seed film, 142: copper bump, 143: surface metal film, 150: insulation ring, 150a: inner side surface, 150b: outer side surface, 150c: trench for insulation ring, 151: opening (hole), 155: silicon nitride film, 160: backside bump, 161: seed film, 162: copper bump, 163: backside metal film, 200: TSV (Through Silicon Via), 321: base substrate, 322, 323, 324: semiconductor chip, 323a: backside bump, 323b: topside bump, 323c: TSV, 325: attaching film, 326: lead frame, 327: soldered ball, 328: wiring layer, 329: terminal, 330: resin, 400: printed substrate, 401: I/O terminal, 402: DRAM package, 403: control chip, 500: data processing device, 502: calculation processing device, 510: system bus, 520: calculation processing device, 530: DRAM memory module, 540: ROM (Read Only Memory), 550: non-volatile storage device, 560: I/O device, D: device region, S: scalloping, T1: tapered portion, T2: vertical portion, TV: TSV region, V: through-plug

DESCRIPTION OF PREFERRED ILLUSTRATIVE EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

A specific semiconductor device according to this present exemplary embodiment will be explained with reference to FIGS. 1 to 10. FIG. 1 is a sectional view of a semiconductor chip including a through silicon via (TSV), which is a semiconductor device of this exemplary embodiment. The semiconductor chip may include a storage device such as DRAM, SRAM, flash memory and the like and a calculation processing device such as MPU, DSP and the like.

As shown in FIG. 1, a semiconductor chip 100 comprises a device region D and a TSV region TV. In the device region D, a device such as MOS transistor is arranged, so that a predetermined circuit is configured. In the TSV region, a plurality of TSVs 200 are arranged. In FIG. 1, only one TSV is shown.

The TSV 200 includes bumps (protrusion electrodes) for connection at upper and lower ends. When stacking a plurality of semiconductor chips, the semiconductor chips, which are arranged above and below, are electrically connected to each other via the TSV 200. The TSV 200 includes a through-plug V penetrating the semiconductor substrate 50, a contact plug penetrating a plurality of interlayer insulation films on the semiconductor substrate 50 and a wiring layer. An insulation ring 150 is provided around a part of the TSV embedded in the semiconductor substrate. By the insulation ring, the insulation among the individual TSV 200, the other TSVs and the device region D is secured.

The insulation ring 150 is formed by filling a ring-shaped opening formed in the semiconductor substrate 50 with a silicon oxide film by using the manufacturing method of this exemplary embodiment. An end portion of the TSV on a backside (a lower side of FIG. 1) of the semiconductor substrate 50 constitutes a backside bump 160. In other words, a part of the backside bump 160 penetrates through the semiconductor substrate.

FIG. 25A is an enlarged view of a part of the semiconductor device surrounded by the dotted line of FIG. 1 and FIG. 25B is a sectional view taken along a line A-A of FIG. 25A. In FIG. 25, the scalloping is omitted. As shown in FIG. 25, the insulation ring 150 is provided to surround a part of the backside bump 160. The insulation ring 150 has a tapered portion X and a vertical portion Y. The tapered portion X has a sectional area that is gradually decreased from a first surface 5 toward a thickness direction of the semiconductor substrate 50. The vertical portion Y has a constant sectional area that is smaller than the minimum value of the sectional area of the tapered portion and the sectional area thereof is not changed in the thickness direction of the semiconductor substrate 50. In addition, the insulation ring 150 has two side surfaces, i.e., an inner side surface 150a and an outer surface 150b surrounding the backside bump. In the tapered portion, a distance $L_1$ between the two side surfaces is gradually decreased from the first surface 5 toward the thickness direction of the semiconductor substrate 50. In the vertical portion, a distance $L_2$ between the two side surfaces is constant and is not changed in the thickness direction of the semiconductor substrate 50. In addition, the distance $L_2$ is smaller than the minimum value of the distance $L_1$ between the two side surfaces of the tapered portion.

As shown in FIG. 1, an end portion of the TSV on a topside (an upper side of FIG. 1) of the semiconductor substrate 50 constitutes a topside bump 140. When stacking the plurality of semiconductor chips, the backside bump 160 is bonded with the topside bump 140 provided to the lower chip. The through plug V having integrated with the backside bump 160 penetrates through the semiconductor substrate 50 and is connected to a local wiring (local wiring layer) 127. The local wiring 127 is also provided to the device region D and is used as a part of the wiring layer configuring the circuit.

The local wiring 127 connected to the through plug V is connected to a first wiring 106 of the upper layer via first contact plugs 130. The first wiring 106 is connected to a second wiring 109 of the upper layer via second contact plugs 131. The second wiring 109 is connected to a third wiring 112 of the upper layer via third contact plugs 132. The topside bump 140 is formed so as to connect to the third wiring 112. In the meantime, although not shown, the topside bump 140 and the backside bump 160 of the TSV 200 may be connected with each other and the TSV may include an internal wiring that is electrically connected to the MOS transistor formed in the device formation region D through any one of the local wiring 127, the first wiring 106, the second wiring 109 and the third wiring 112. In addition, as required, one of the first to third contact plugs may be omitted to form an electrode in which the topside bump 140 and the backside bump 160 are not electrically connected therebetween.

In the below, a method of manufacturing the semiconductor device including the TSV will be explained.

Figure 2:
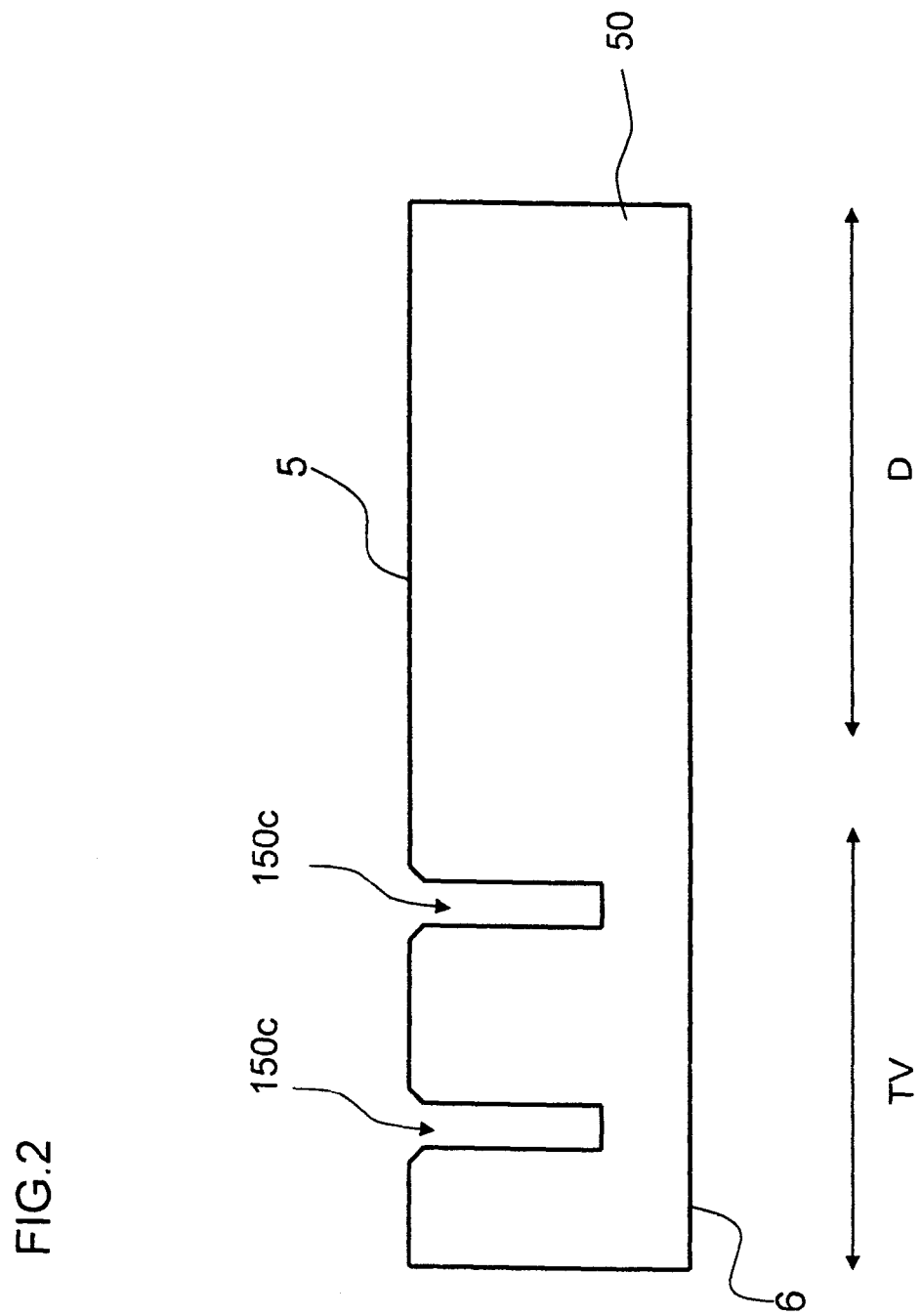
FIGS. 2 to 17 show a method of manufacturing the semiconductor device of the first exemplary embodiment.

As shown in FIG. 2, a semiconductor substrate 50 of P-type silicon (Si) is prepared and a trench for insulation ring 150c for an insulation ring is formed in the TSV region TV. The trench for insulation ring 150c has a ring shape, when from a plan view, so as to surround the through plug V that will be formed later. In FIG. 2, the scalloping on the side surface of the opening is omitted for simplification (which is also the same as in FIGS. 10-18).

In the below, a method of forming the trench for insulation ring 150c will be specifically explained with reference to FIGS. 3 to 9. In FIGS. 3 to 9, a shape of the scalloping is exaggerated for clear explanation.

Figure 3:
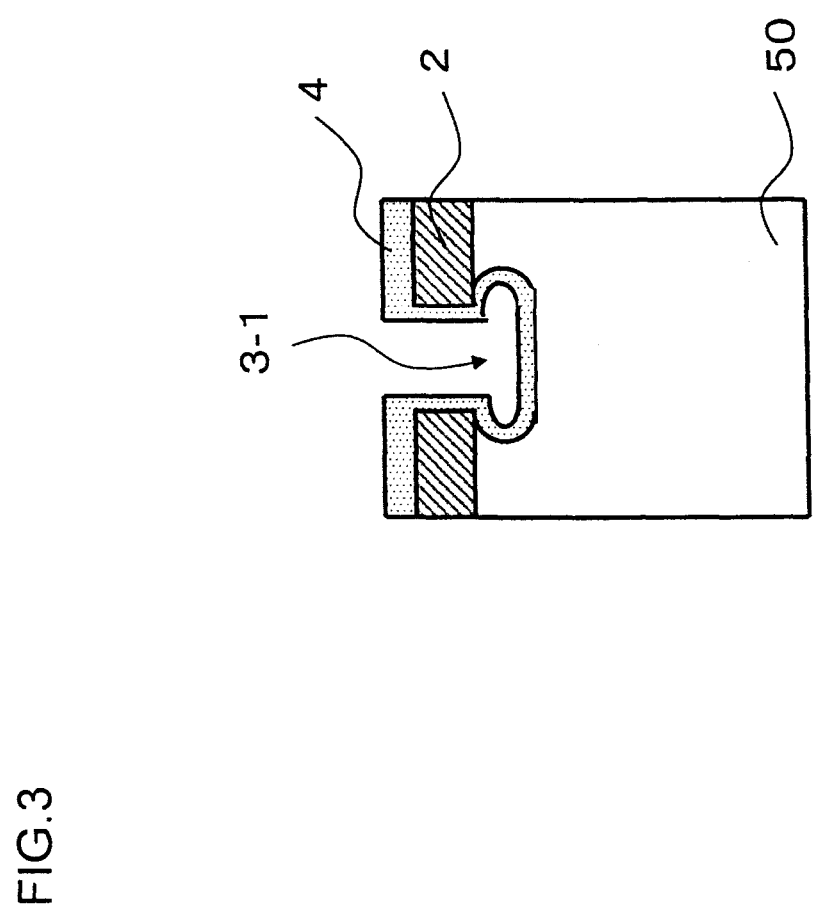

As shown in FIG. 3, a mask pattern 2 including an opening is formed on the semiconductor substrate 50 using silicon. A material of the mask pattern 2 is not particularly limited as long as it has resistance to the etching. For example, the mask pattern 2 can be formed by using a photoresist film, a silicon oxide film ($SiO_2$), a silicon nitride film ($Si_3N_4$) and the like. An opening is formed in a region of the semiconductor substrate 50, which is not covered by the mask pattern 2. In this exemplary embodiment, it is not necessary to beforehand form a special step shape in the mask pattern 2.

As the etching apparatus, it is possible to use a single wafer high density plasma etching apparatus of an ICP (inductively-coupled plasma) manner. As a first etching process in a first cycle, the dry etching having high isotropy is performed using $SF_6$ gas, thereby forming a third opening 3-1 having a depth d1. The specific etching conditions may be exemplified as follows.

gas type: $SF_6$
gas flow rate: 230 to 270 sccm
pressure: 80 to 100 mTorr
source power: 2300 to 2700 W.

In this exemplary embodiment, in the first cycle, the etching time of four seconds is set, so that the third opening 3-1 having the depth d1 of about 1 µm is formed. In the etching process, bias power is controlled separately from source power for controlling a density of the plasma, so that the energy of ions reaching the semiconductor substrate is controlled to optimally set a degree of the isotropy.

In the first etching process, the bias power that is applied to the semiconductor substrate is set so as to be weak (for example, 50 to 60 W) and the side etching is made. Thereby, the etching can be performed with the high isotropy.

As shown in FIG. 3, as a deposition process in the first cycle, the same etching device is used to form a protective film 4 that covers an inner wall of the third opening 3-1. The specific deposition conditions may be exemplified as follows.

gas type: $C_4F_8$
gas flow rate: 230 to 270 sccm
pressure: 60 to 80 mTorr
source power: 2300 to 2700 W.

In the deposition process, the bias power is not applied. By the deposition process, the protective film 4, which includes, as a main component, fluoro carbon-based polymer, is formed so as to cover the inner wall of the third opening 3-1 and a top surface of the mask pattern 2.

Figure 4:
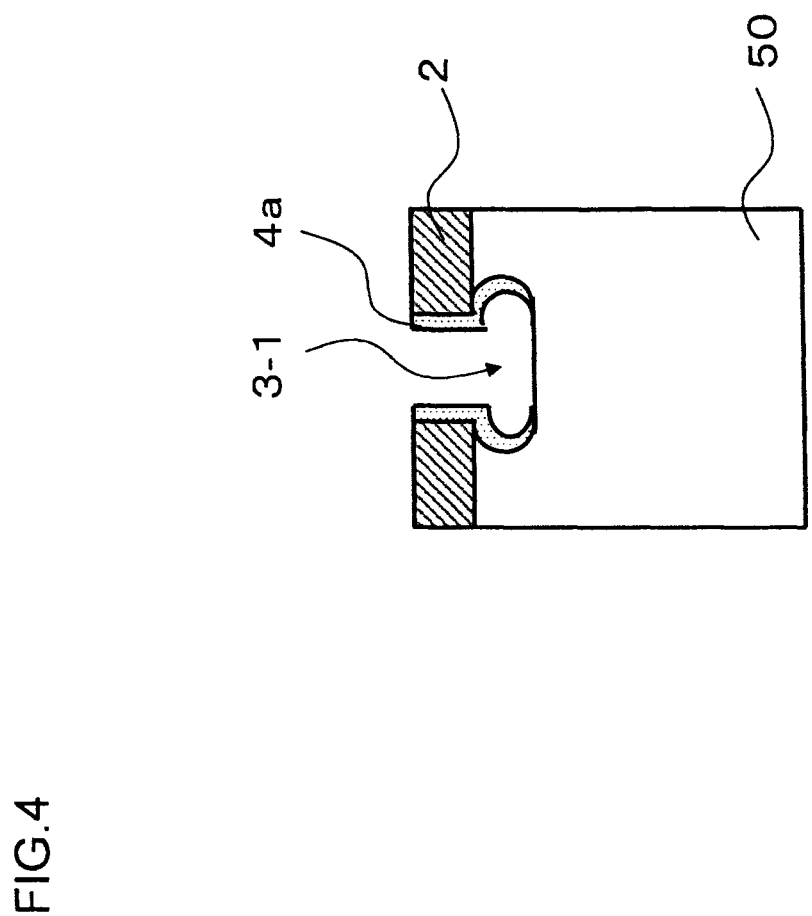

As shown in FIG. 4, as a second etching process in the first cycle, the same etching device is used to perform the dry etching having high anisotropy and using the same gas as the first etching process, so that the protective film 4 deposited on a bottom surface of the third opening 3-1 is removed. The specific etching conditions may be exemplified as follows.

gas type: $SF_6$
gas flow rate: 230 to 270 sccm
pressure: 60 to 80 mTorr
source power: 2300 to 2700 W.

In the second etching process, the bias power that is applied to the semiconductor substrate is set to be stronger (for example, 150 to 160 W) than that of the first etching process and the side etching is thus suppressed. Thereby, it is possible to perform the etching with the high anisotropy. Thus, it is possible to remove the protective film on the bottom surface of the third opening 3-1 while remaining the protective film 4a on the inner wall side surface of the third opening 3-1.

By sequentially performing the first etching process, the deposition process and the second etching process, as described above, the first cycle of the etching process is completed.

Figure 5:
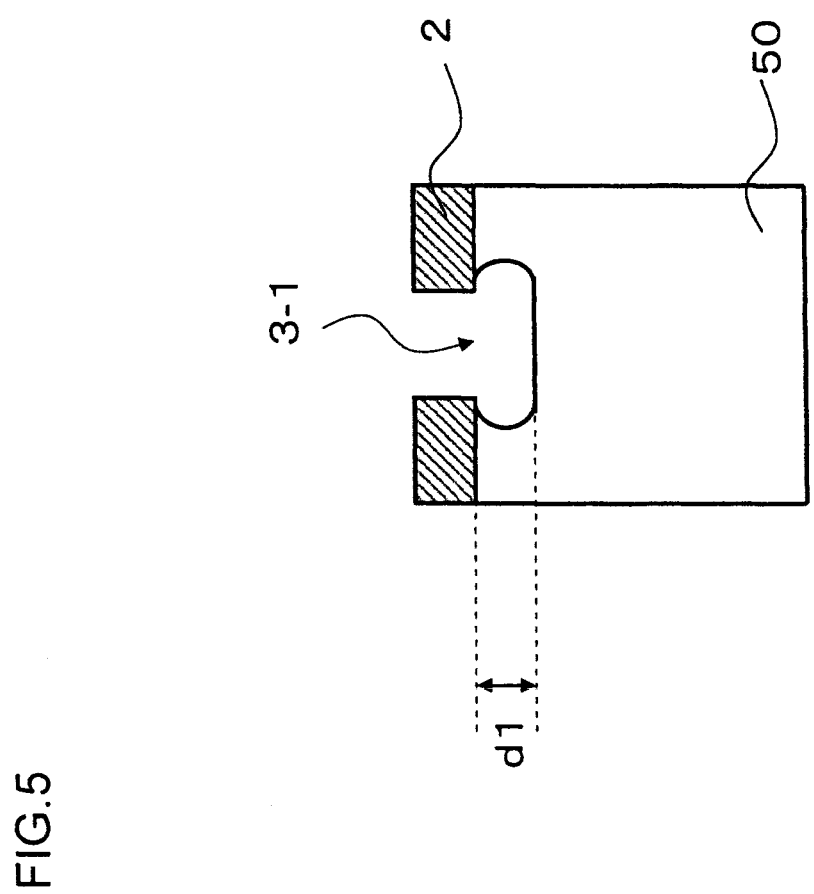
Figure 6:
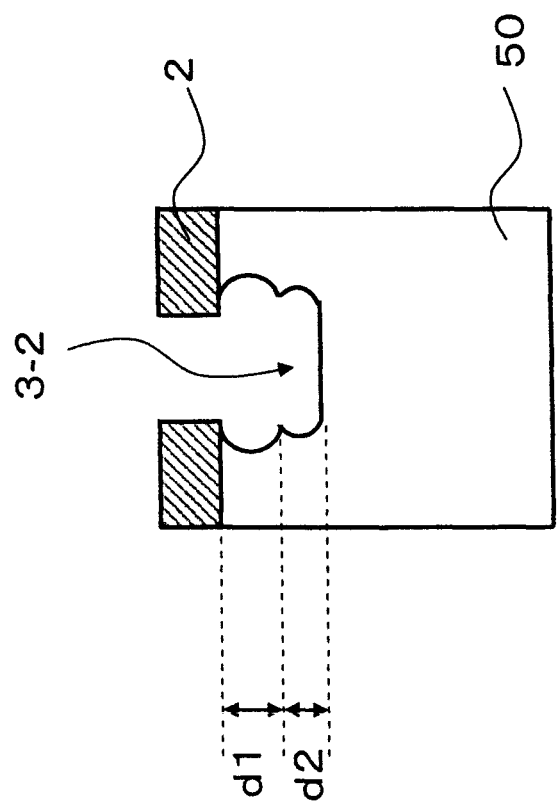

As shown in FIG. 5, at the state in which the inner wall side surface of the third opening 3-1 are covered by the protective film 4a (in FIG. 5, the protective film 4a is not shown. The protective film 4a is not shown in the below drawings), a second cycle including the first etching process, the deposition process and the second etching process is performed, like the first cycle. At this time, the gas type, the pressure, the applying power used and the like are set to be the same as those in the respective processes of the first cycle. However, the first etching process is performed on condition that the etching time of the first etching process is shortened by predetermined time t1. In this exemplary embodiment, t1 is one second and the etching is performed for three seconds. Thereby, a third opening 3-2 having a depth d2 of about 0.75 µm is formed.

Since the inner wall side surface of the third opening 3-1 are covered with the protective film 4a, the side etching does not proceed. In the meantime, a part of the protective film 4a is also removed by the etching. In this exemplary embodiment, the second cycle is set so that the etching time of the first etching process is shorter by t1 than the first cycle.

Thereby, the depth d2 of the third opening 3-2 becomes shallower than the depth d1 of the third opening 3-1 and the side etching amount of the third opening 3-2 becomes also smaller than that of the third opening 3-1. On the other words, the depth d1 may correspond to a first convex arc, and the depth d2 may correspond to a second convex arc. The first convex arc is larger than the second convex arc. The first convex arc may be placed to be indented from a center of the third opening 3-1, (a center of an insulating ring 150 shown in FIG. 10), compared with the second convex arc. The word "convex" can be translated to "concave" from point of view of the semiconductor substrate 1.

Continuously, like the first cycle, the deposition process and the second etching process are sequentially performed, so that the second cycle is completed. At the completion time of the second cycle, the inner wall side surface of the third openings 3-1, 3-2 are covered with the protective film 4a.

Figure 7:
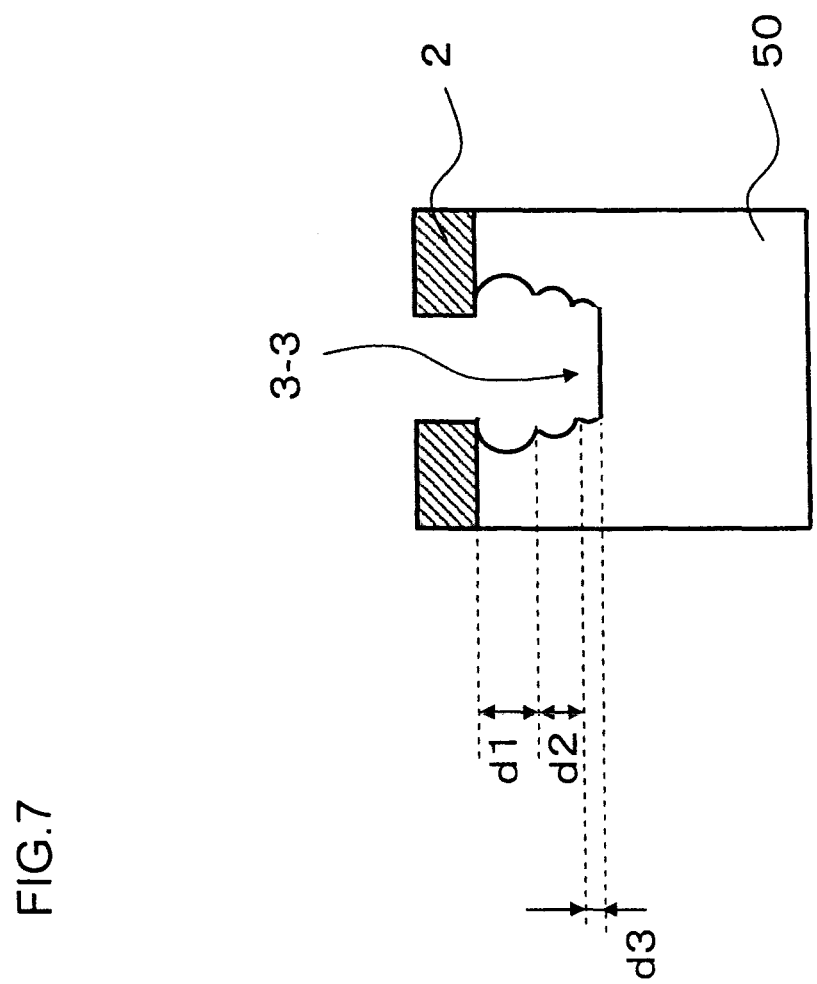

As shown in FIG. 7, at the state in which the inner walls of the third openings 3-1, 3-2 are covered with the protective film 4a, a third cycle including the first etching process, the deposition process and the second etching process is performed, like the second cycle. At this time, the gas type, the pressure, the applying power used and the like are set to be the same as those in the respective processes of the first cycle. However, the first etching process is performed on condition that the etching time of the first etching process is shortened by predetermined time t1, compared to the second cycle. In this exemplary embodiment, t1 is one second and the etching is performed for two seconds. Thereby, a third opening 3-3 having a depth d3 of about 0.5 µm is formed.

Since the inner wall side surface of the third openings 3-1, 3-2 are covered with the protective film, the side etching does not proceed. In this exemplary embodiment, the third cycle is set so that the etching time of the first etching process is shorter by t1 than the second cycle. Thereby, the depth d3 of the third opening 3-3 becomes shallower than the depth d2 of the third opening 3-2 and the side etching amount of the third opening 3-3 becomes also smaller than that of the third opening 3-2.

Continuously, like the second cycle, the deposition process and the second etching process are sequentially performed, so that the third cycle is completed.

By performing the first to third cycles, a first opening having a tapered shape is formed. In the specification, each opening, which is formed every one cycle in the first to third cycles, is referred to as 'third opening', and an opening having a tapered shape and including the plurality of third openings is referred to as 'first opening.'

Figure 8:
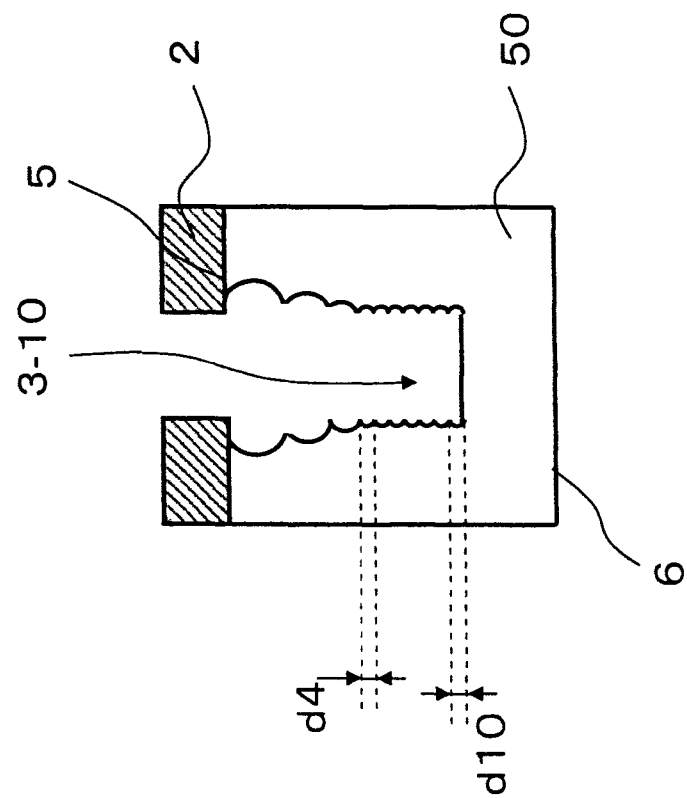

As shown in FIG. 8, in the cycles after the fourth cycle, the etching time of the first etching process is fixed with time shorter than the etching time in the first etching process of the third cycle. In this exemplary embodiment, the etching time of the first etching process is fixed with one second. By repeating the cycle several time, in which the first etching time having the fixed etching time, the deposition process and the second etching process are sequentially performed, a second opening having a predetermined depth is formed. In FIG. 8, it is shown that fourth openings 3-10 are formed by performing the cycle up to tenth cycle. In the specification, each opening, which is formed every one cycle in the fourth to tenth cycles, is referred to as 'fourth opening', and an opening having substantially vertical inner wall side surface and including the plurality of fourth openings is referred to as 'second opening.'

From the fourth cycle to the tenth cycle, the depths d4 to d10 of the fourth openings that are formed in the respective cycles are the substantially same. In addition, the side etching amount of each fourth opening is also the substantially same. Thereby, in the fourth to tenth cycles, it is possible to form a second opening having a substantially vertical shape. In other words, the depths d4 to d10 may correspond to a plurality of third convex arcs connected in series. The third convex arc is smaller than the first convex arc and the second convex arc. Each of the third convex arcs is substantially identical to each other.

FIG. 8 shows the first to tenth cycles. However, by repeating the same cycle, it is possible to deepen a depth of the second opening. After the fourth cycle, the etching time of the first etching process in which the side etching is performed is set to be shorter than the third cycle. Accordingly, a concavo-concave shape of the scalloping formed on the side surface of the fourth opening becomes sufficiently small.

After the first etching process is completed in the final cycle, an ashing process may be performed by using the oxygen gas so as to remove the protective film remaining in the opening.

Figure 9:
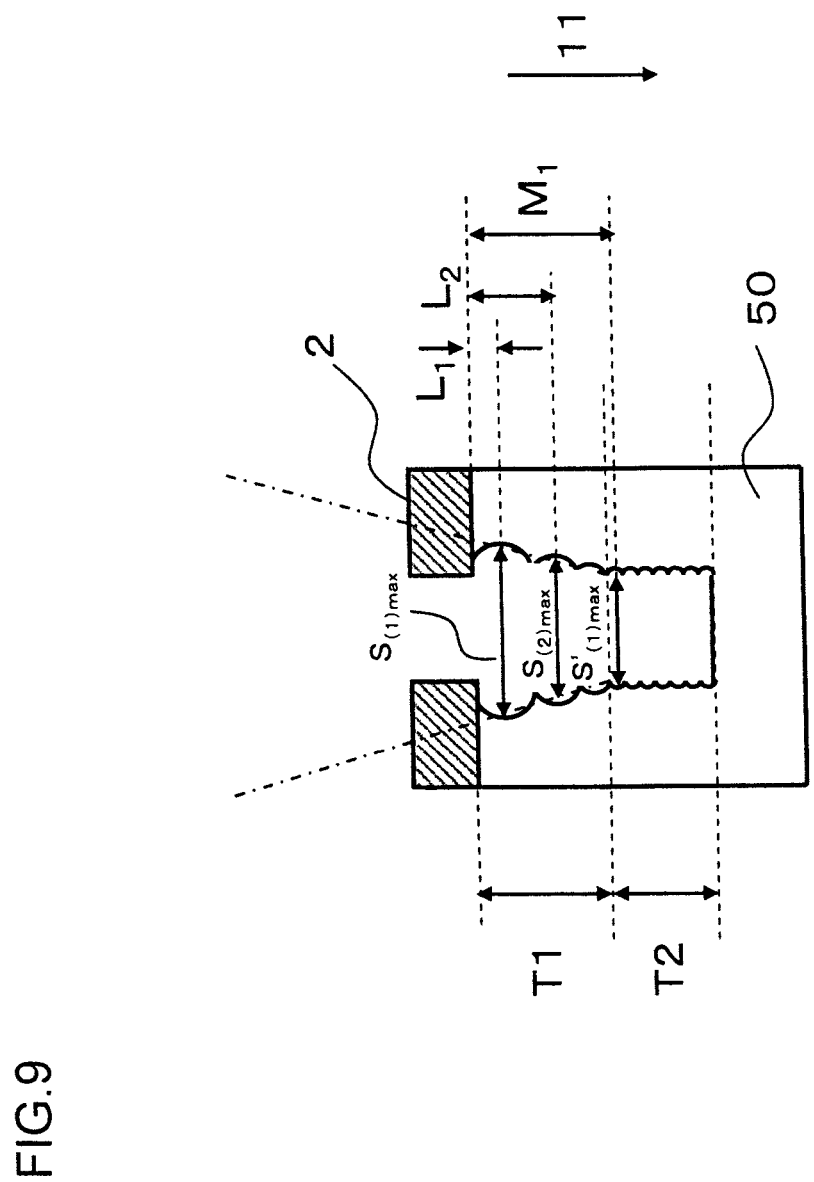

A sectional view of the opening finally formed is shown in FIG. 9. In this exemplary embodiment, it is possible to form an opening (hole) including a first opening T1 having a tapered shape at an upper end and a second opening T2 having a substantially vertical shape by using the Bosch process.

In the second opening T2, an opening having the substantially equivalent area to an opening area of the mask pattern 2 is formed. In the first opening T1, an opening having an area larger than an opening area of the mask pattern 2 at the uppermost end is formed.

Since each of the third openings formed in the first opening T1 has the shape formed by the isotropic etching, the inner wall side surface of each third opening have a recessed shape. Accordingly, each of the third openings has a sectional area $S_{(n)}$ (n: an integer of 1 or greater) of a section perpendicular to a thickness direction of the semiconductor substrate 50, which is changed as each of the third openings proceed toward an inward direction 11 (a direction proceeding from the first surface 5 of the semiconductor substrate 50 to a second surface 6 that is a backside) of the semiconductor substrate in the thickness direction. Also, in one third opening, the sectional area $S_{(n)}$ is gradually increased as the third opening proceeds from a position closest to the first surface 5 along the direction 11, so that it has the maximum value $S_{(n)max}$ at a substantially half depth of the thickness direction of the silicon substrate 50. The sectional area $S_{(n)}$ is gradually decreased as the third opening further proceeds from the substantially half depth of the thickness direction along the direction 11. In other words, in one third opening, the sectional area $S_{(n)}$ is the smallest at the position closest to the first surface 5 between the position closest to the first surface 5 and the position of the substantially half depth of the thickness direction of the silicon substrate 50. Likewise, in one third opening, the sectional area $S_{(n)}$ is the smallest at a position farthest from the first surface 5 between the position of the substantially half depth of the thickness direction of the silicon substrate 50 and the position farthest from the first surface 5.

Here, the sectional area of the $n^{th}$ third opening from the first surface 5 toward the thickness direction 11 is indicated with $S_{(n)}$. For example, for the $1^{st}$ third opening, the sectional area $S_{(1)}$ has $S_{(1)max}$ at a position of the depth $L_1$. Likewise, for the $2^{nd}$ third opening from the first surface 5 toward the thickness direction, the sectional area $S_{(2)}$ has $S_{(2)max}$ at a position of the depth $L_2$.

By stepwise shortening the time of the first etching process of the first cycle in which the first opening T1 is formed, the side etching is stepwise decreased, resulting in obtaining a tapered shape, in which the maximum value $S_{(n)max}$ of the sectional area of each third opening is decreased as the first opening proceeds toward the thickness direction 11.

The tapered shape is not configured by a smooth tapered surface. As described above, since the side surface of each third opening have a recessed shape by the isotropic etching, the tapered shape is configured by a surface having a concavo-concave shape. In addition, the depth of each third opening is gradually decreased as the third opening proceeds in the inward direction 11 of the thickness direction of the semiconductor substrate 50.

Since each of the fourth openings formed in the second opening T2 has the shape formed by the isotropic etching, the inner wall side surface of each fourth opening have a recessed shape. Accordingly, each of the fourth openings has a sectional area $S'_{(a)}$ (a: an integer of 1 or greater) of a section perpendicular to the thickness direction of the semiconductor substrate 50, which is changed as the fourth opening proceeds toward the inward direction 11 of the semiconductor substrate with respect to the thickness direction. Also, in one fourth opening, the sectional area $S'_{(a)}$ is gradually increased as the fourth opening proceeds from a position closest to the first surface 5 along the direction 11, so that it has the maximum value $S'_{(a)max}$ at a substantially half depth of the thickness direction of the silicon substrate 50. The sectional area $S'_{(a)}$ is gradually decreased as the fourth opening further proceeds from the substantially half depth of the thickness direction along the direction 11. In other words, in one fourth opening, the sectional area $S'_{(a)}$ is the smallest at the position closest to the first surface 5 between the position closest to the first surface 5 and the position of the substantially half depth of the thickness direction of the silicon substrate 50. Likewise, in one fourth opening, the sectional area $S'_{(a)}$ is the smallest at a position farthest from the first surface 5 between the position of the substantially half depth of the thickness direction of the silicon substrate 50 and the position farthest from the first surface 5.

Here, the sectional area of the fourth opening closest to the first surface 5 regarding the thickness direction of the silicon substrate 50 is indicated with $S'_{(1)}$ and the sectional area of the $a^{th}$ fourth opening as the second opening proceeds in the thickness direction 11 is indicated with $S'_{(a)}$. For example, for the $1^{st}$ fourth opening, the sectional area $S'_{(1)}$ has $S'_{(1)d\ max}$ at a position of the depth $M_1$ from the first surfaces of the silicon substrate 50. Since the respective fourth openings are formed under the same conditions, the maximum values $S'_{(a)max}$ of the sectional areas of the respective fourth openings are the same. In addition, the depths of the respective fourth openings are also the same. By performing the formation of the fourth opening under the same conditions at least two times, the second opening T2 is formed.

In the above description, the first opening is formed in the three-step cycles. However, the first opening may be formed by increasing the number of cycles more than the above described process. In addition, the time that is used in the first etching process may be also arbitrarily set. In other words, in this exemplary embodiment, the etching time (time E1) of the first etching process in the first cycle is first set depending on an opening width (side etching width) to be formed. In addition, the step time t1 of decreasing the etching time is set.

Next, the etching time En of the first etching process in the $n^{th}$ cycle (n: integer of 2 or greater) is set so that En=E1−t1×(n−1), and the process is sequentially performed up to the $n^{th}$ cycle. Continuously, the cycle is performed k times (k: integer of 2 or greater), so that the first etching process is performed for the time E1 that is fixed to be longer than the etching time En of the first etching process in the $n^{th}$ cycle that has been finally performed in the process of forming the first opening, thereby the second opening is formed.

In this exemplary embodiment, the opening width of the upper end of the first opening can be enlarged by performing the first cycle only one time when forming the first opening. However, it is preferable to perform the cycle of forming the first opening at least two times (n=2 or greater) so as to improve the embedding characteristic of the insulation film and the like into the opening. This is because when the cycle of forming the first opening is performed only one cycle, the opening width is rapidly changed at a boundary between the first opening and the second opening, so that an insulation film to be embedded may be easily blocked at the boundary. Since the smooth tapered shape is obtained by setting the step time t1 small and increasing the number of cycles n for forming the tapered shape, the improvement effect on the embedding characteristic of the insulation film is increased.

The above manufacturing conditions (gas flow rate, pressure and the like) described in the first and second etching processes and deposition process are simply exemplary and can be changed as long as it does not depart from the scope of the invention. It is easiest to control the shape of the first opening by changing the etching time of the respective cycles, as described above. However, the shape of the first opening can be controlled by gradually changing the applying condition of the bias power in the first etching process of performing the etching having high isotropy every cycle (for example, by increasing the bias power every one cycle).

The above formation conditions of the first and second openings are exemplary and may be appropriately changed depending on the depths and opening widths of the first and second openings. For example, it is possible to form the trench for insulation ring 150c having a depth of about 45 μm, the tapered portion having a depth of about 3 to 4 μm and the vertical portion having an opening width of about 2 to 3 μm. In this case, contrary to the above conditions, by setting the initial value of the etching time E1=4 seconds and the step time t1=0.5 second and repeating the five-step cycles (k=5), it is possible to form the first opening. In addition, the second opening is formed by repeating the cycle about 200 times.

Figure 10:
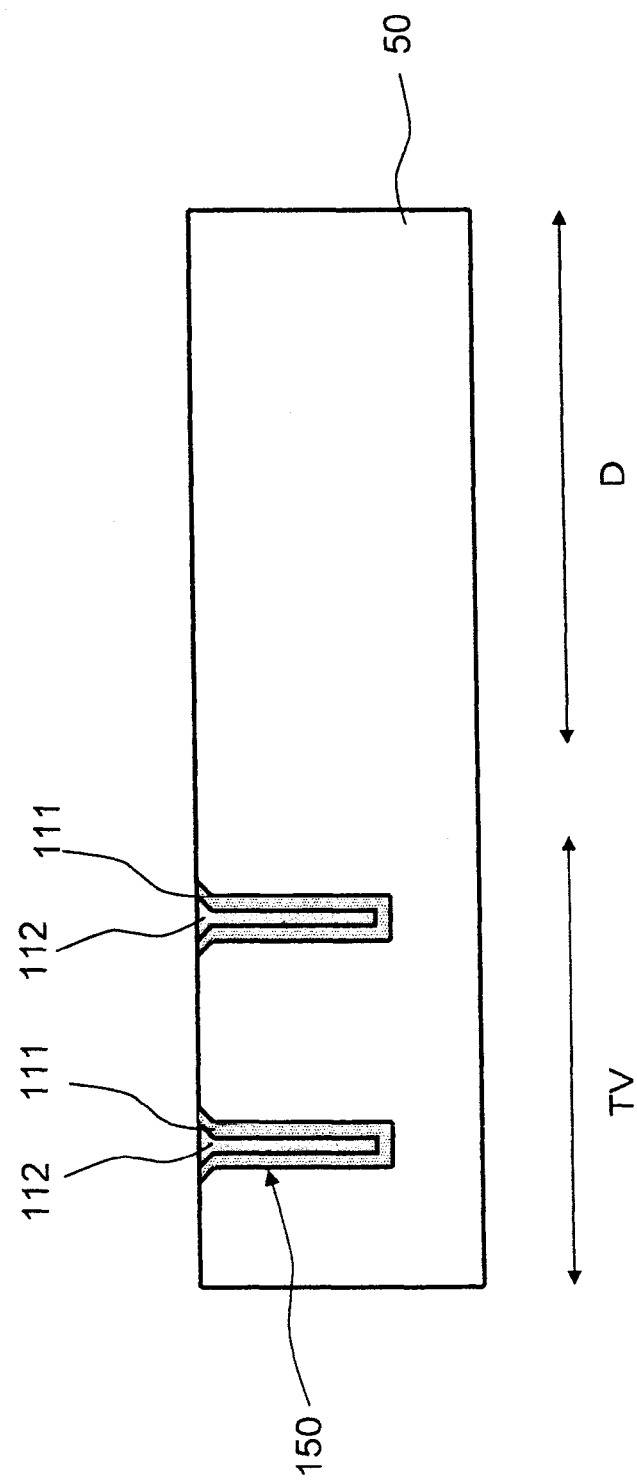

As shown in FIG. 10, a silicon nitride film 111 is formed to cover the inner wall of the trench for insulation ring 150c by a CVD method and then the insulation film 150c is filled with a silicon oxide film 112 using the CVD method. The silicon nitride film 111 and the silicon oxide film 112 on the top surface of the semiconductor substrate are removed by the etching so that the silicon nitride film 111 and the silicon oxide film 112 remain only in the trench for insulation ring 150c. Thereby, the insulation ring 150 is formed.

In this exemplary embodiment, the formed trench for insulation ring 150c has an aspect ratio of about 15 to 20. Accordingly, when a recess having a vertical shape is formed by the related art, it is difficult to fill the recess with the silicon oxide film 112 so that a void is not formed in the recess. To the contrary, according to this exemplary embodiment, the trench for insulation ring 150c is formed to include the tapered portion, to prevent a void from being formed in the trench for insulation ring when filling the recess with the silicon oxide film 112. Thereby, it is possible to prevent a crack from being generated from the insulation ring 150 during the manufacturing process, thereby suppressing the manufacturing yield from being lowered.

Figure 11:
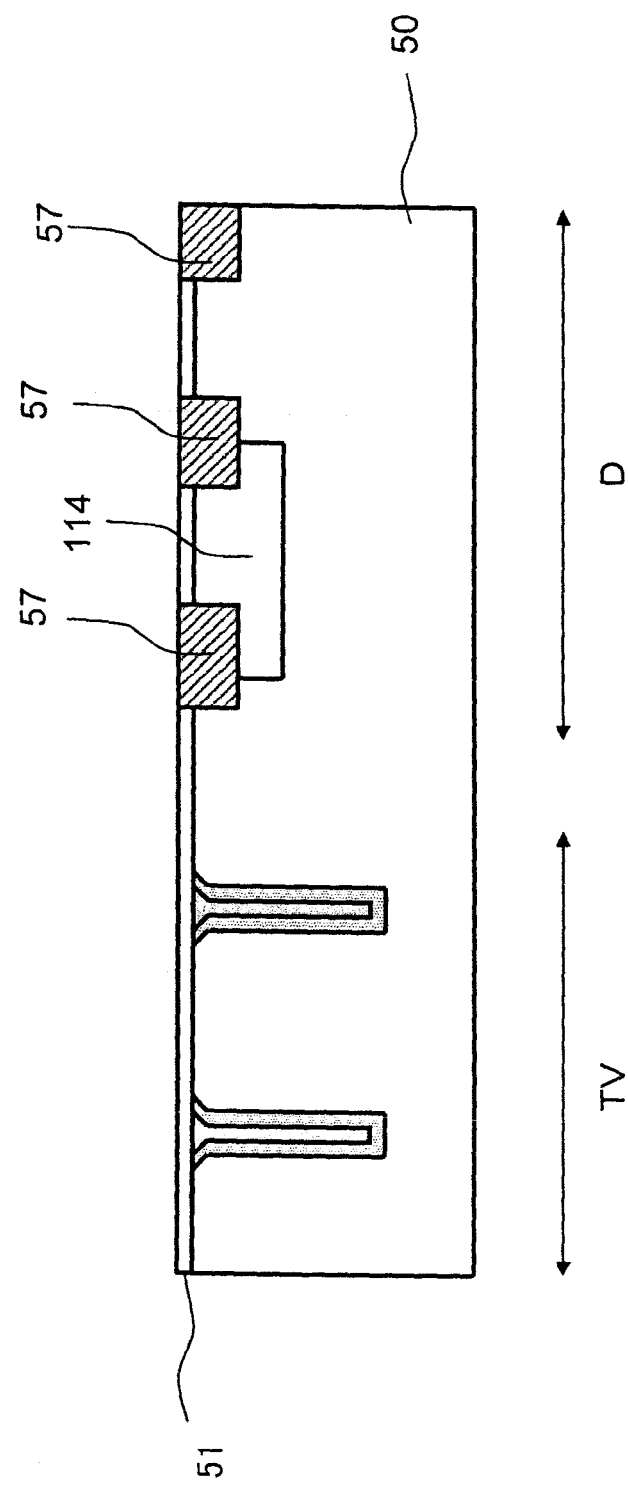

As shown in FIG. 11, in the device region D, isolation regions 57 for dividing activation areas of MOS transistors are formed by an STI method. The N-type impurities such as phosphorous are introduced into the semiconductor substrate 50 by ion implantation, to form an N-type well 114 is formed. In the N-type well 114, a P channel-type MOS transistor is disposed in a later process. Likewise, boron (B) may be ion-implanted in a region except for the N-type well, thereby forming a P-type well.

After the surface of the clean semiconductor substrate 50 is exposed, a gate insulation film 51 is formed on the surface of the semiconductor substrate 50 by a silicon oxide film formed by a thermal oxidation method and the like and having a film thickness of about 4 to 7 nm. As the gate insulation film 51, a high-K film (high dielectric film) may be used.

Figure 12:
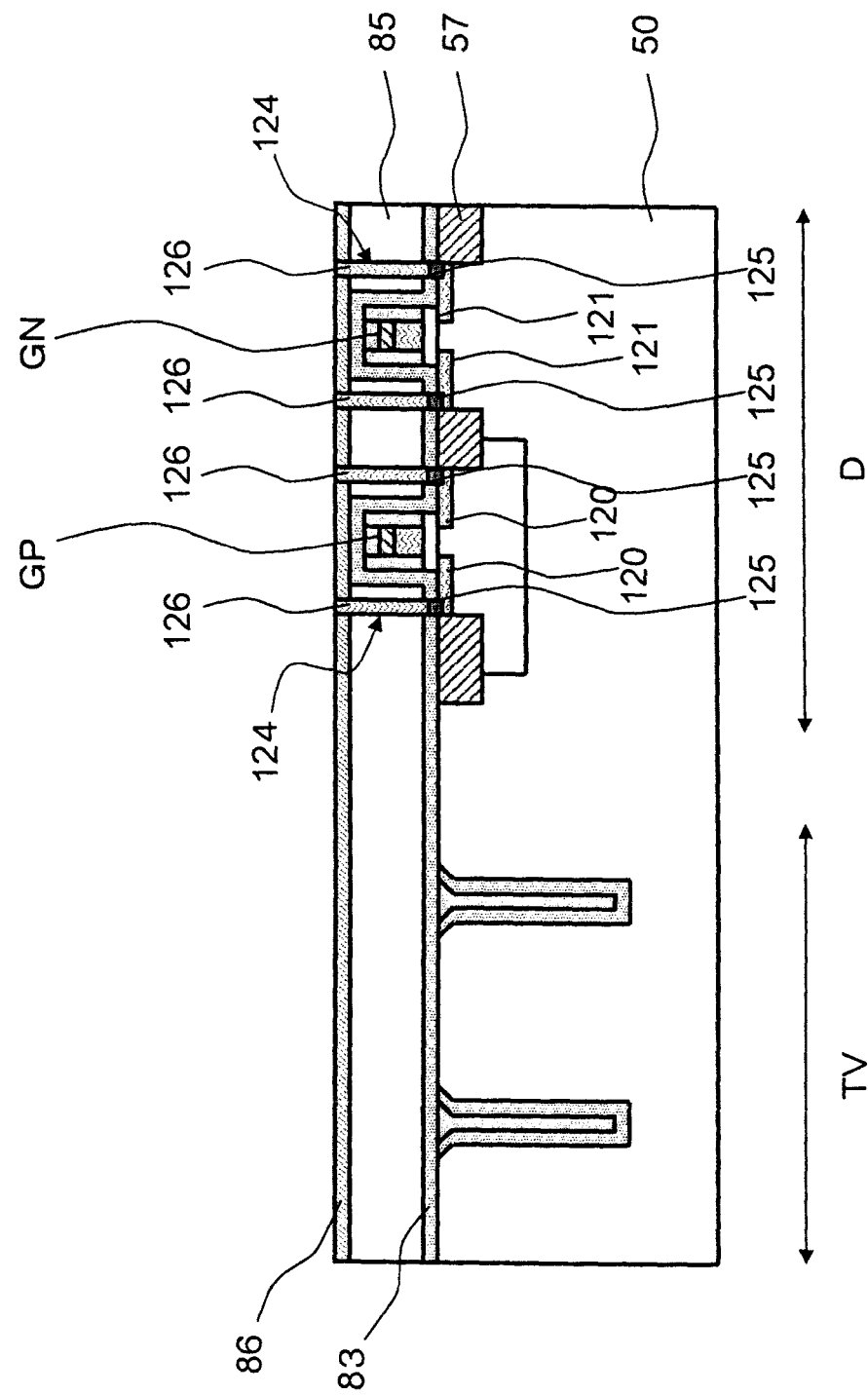

As shown in FIG. 12, a gate electrode GP and a P-type impurity diffusion layer 120 of the P channel-type MOS transistor and a gate electrode GN and an N-type impurity diffusion layer 121 of the N channel-type MOS transistor are formed. The P-type impurity diffusion layer 120 functions as source/drain electrodes of the P channel-type MOS transistor. The N-type impurity diffusion layer 121 functions as source/drain electrodes of the N channel-type MOS transistor. The source/drain electrodes may be formed so as to include an LDD structure by forming side wall insulation films on the side surfaces of the gate electrodes GP, GN.

Continuously, a liner film 83 is formed on the semiconductor substrate 50 with a silicon nitride film having a film thickness of about 10 to 20 nm. Next, after an SOD (Silicon On Directrics; applied insulation film such as poly-silazane) film is deposited by a spinner method, an annealing process is performed under high-temperature vapor (H$_2$O) atmosphere, thereby modifying the solid deposited film and thus forming a first interlayer insulation film 85. The liner film 83 is formed by the oxidation-resistant film to prevent a device of the lower layer, which has been already formed, from being oxidized and damaged when annealing the SOD film.

Continuously, after a top surface of the first interlayer insulation film 85 is smoothed by a CMP process, a silicon oxide film is formed as a second interlayer insulation film 86 by the CVD method, thereby covering the surface of the first interlayer insulation film 85. Instead of the stacked structure of the first interlayer insulation film 85 and the second interlayer insulation film 86, it may be possible to deposit a silicon oxide film at one time by the CVD method.

Next, peripheral contact holes 124 reaching the P-type impurity diffusion layer 120 and the N-type impurity diffusion layer 121 in the device region D are formed by anisotropic dry etching in which a photoresist film is used as a mask pattern. A silicon surface of the semiconductor substrate 50 is exposed on bottoms of the peripheral contact holes 124.

Continuously, a silicide layer 125 such as cobalt silicide (CoSi) is formed on the silicon-exposed parts of the semiconductor substrate 50. After that, a metal film such as tungsten is deposited so as to fill the peripheral contact holes 124. The CMP process is performed so that the metal film 93 such as tungsten remains only in the peripheral contact holes 124. Thereby, peripheral contact plugs 126 that are conducted to the source/drain electrodes of the transistors are formed in the device region D.

Figure 13:
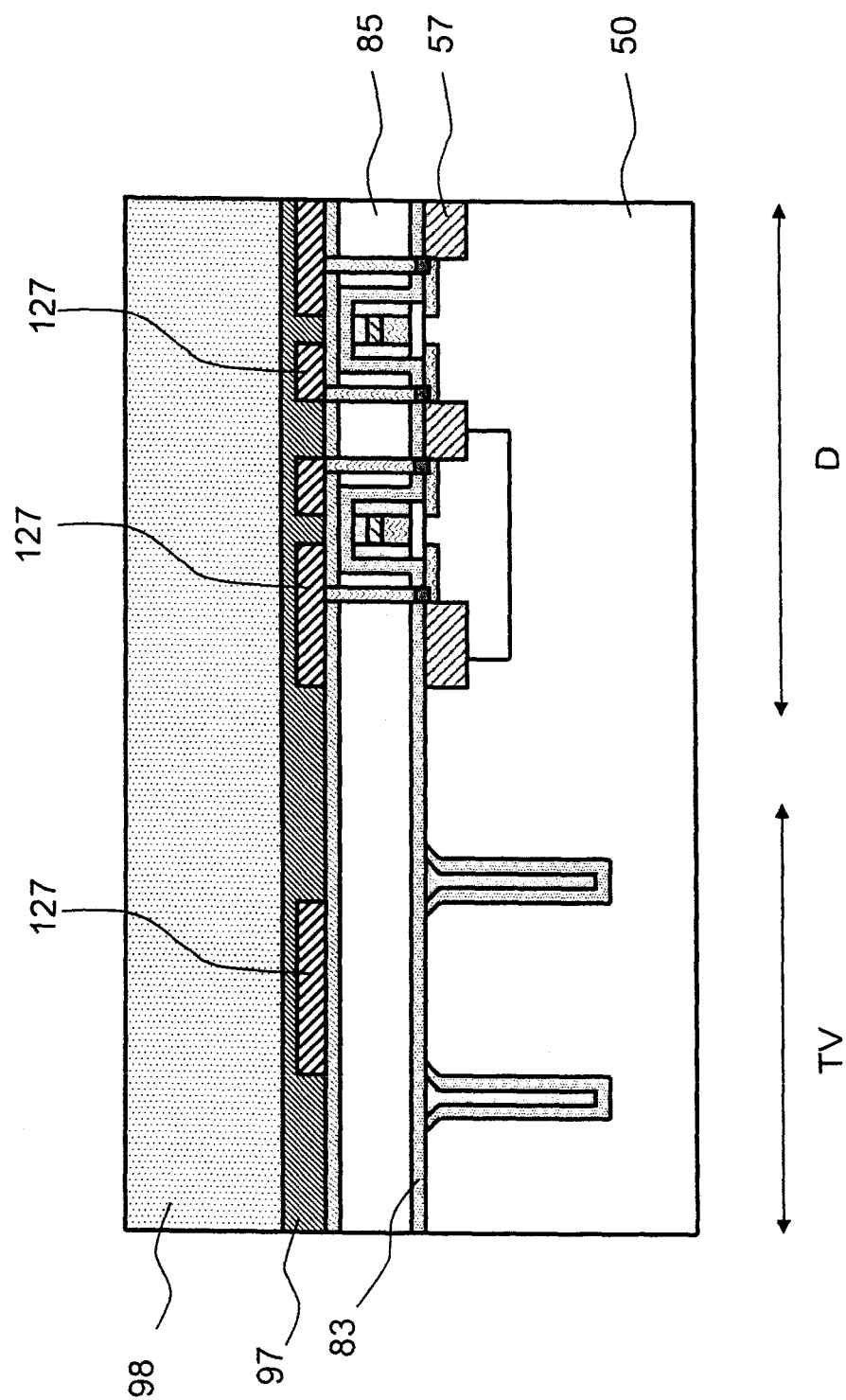

As shown in FIG. 13, tungsten nitride (WN) and tungsten (W) are sequentially deposited to form deposited films, which are then patterned to form local wirings 127. In the device region D, the local wirings 127 are connected to the peripheral contact plugs 126. The local wiring 127 is also disposed in the TSV region TV.

The local wiring 127 that is disposed in the TSV region TV may be conducted with the other local wiring 127 at a part (not shown). The local wiring 127 that is disposed in the TSV region TV functions as a pad for connection to a TSV plug V that is to be formed in a subsequent process. Next, a liner film 97 is formed to cover the local wirings 127 by using a silicon nitride film and then a third interlayer insulation film 98 is used using an SOD film.

Figure 14:
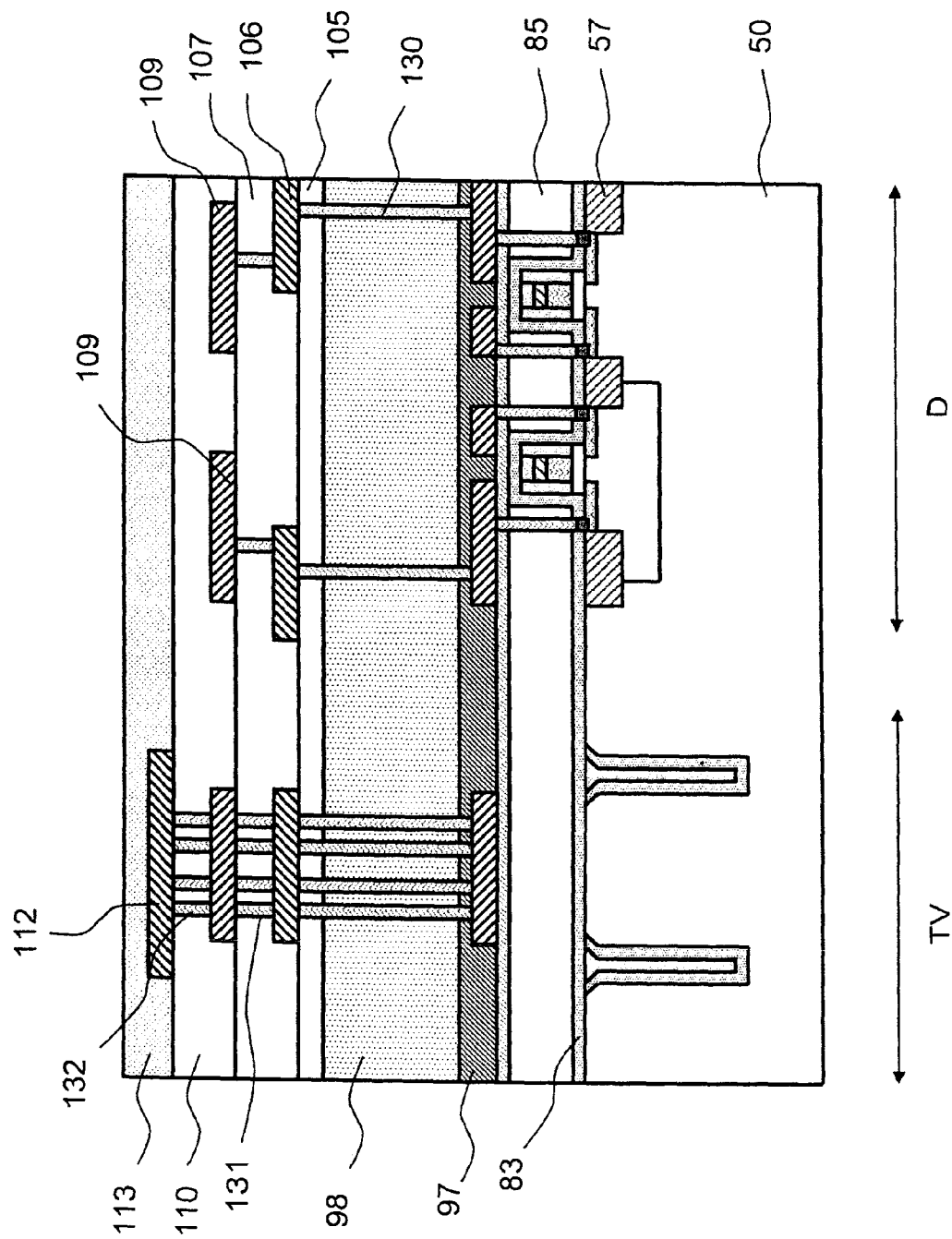

As shown in FIG. 14, a silicon oxide film is formed as a fourth interlayer insulation film 105 by the CVD method, thereby covering a surface of the third interlayer insulation film 98. Instead of the stacked structure of the third interlayer insulation film 98 and the fourth interlayer insulation film 105, a silicon oxide film may be deposited at one time by the CVD method. After that, local contact plugs 130 that are connected to the local wirings 127 in the device region D are formed using a metal film such as tungsten. The local contact plugs 130 are also formed to connect to the local wiring 127 that is disposed in the TSV region TV.

Next, first wirings 106 of the upper layer are formed using aluminum (Al), copper (Cu) and the like. In the device region D and the TSV region TV, the first wirings 106 are formed to connect to the local contact plugs 130. A fifth interlayer insulation film 107 is formed to cover the first wirings 106 using a silicon oxide film and the like. First contact plugs 131 that are connected to the first wirings 106 are formed by a metal film such as tungsten and the like.

Next, second wirings 109 are formed using aluminum (Al), copper (Cu) and the like. In the device region D and the TSV region TV, the second wirings 109 are formed to connect to the first contact plugs 131. A sixth interlayer insulation film 110 is formed to cover the second wirings 109 using a silicon oxide film and the like. Second contact plugs 132 that are connected to the second wirings 109 are formed using a metal film such as tungsten and the like in the TSV region TV.

Next, a third wiring 112 is formed using aluminum and the like. The third wiring 112 is a wiring layer of the uppermost layer and also serves as a pad when forming a bump electrode on a surface thereof. Accordingly, it is preferable not to use a metal film that is apt to be naturally oxidized, such as copper (Cu) and the like. Also in the device region D, the third wiring may be disposed and used as a wiring layer that is connected to the second wirings 109. A surface protective film 113 is formed using a silicon oxynitride (SiON) and the like so as to cover the third wiring 112. In the meantime, when forming the second wirings 109 or third wiring 112, a dual damascene method or aluminum reflow method may be used to form the contact plugs that are connected to lower surfaces of the respective wirings and to form the wiring layer at the same time.

Continuously, a process for forming a through silicon via in the TSV region TV will be described.

Figure 15:
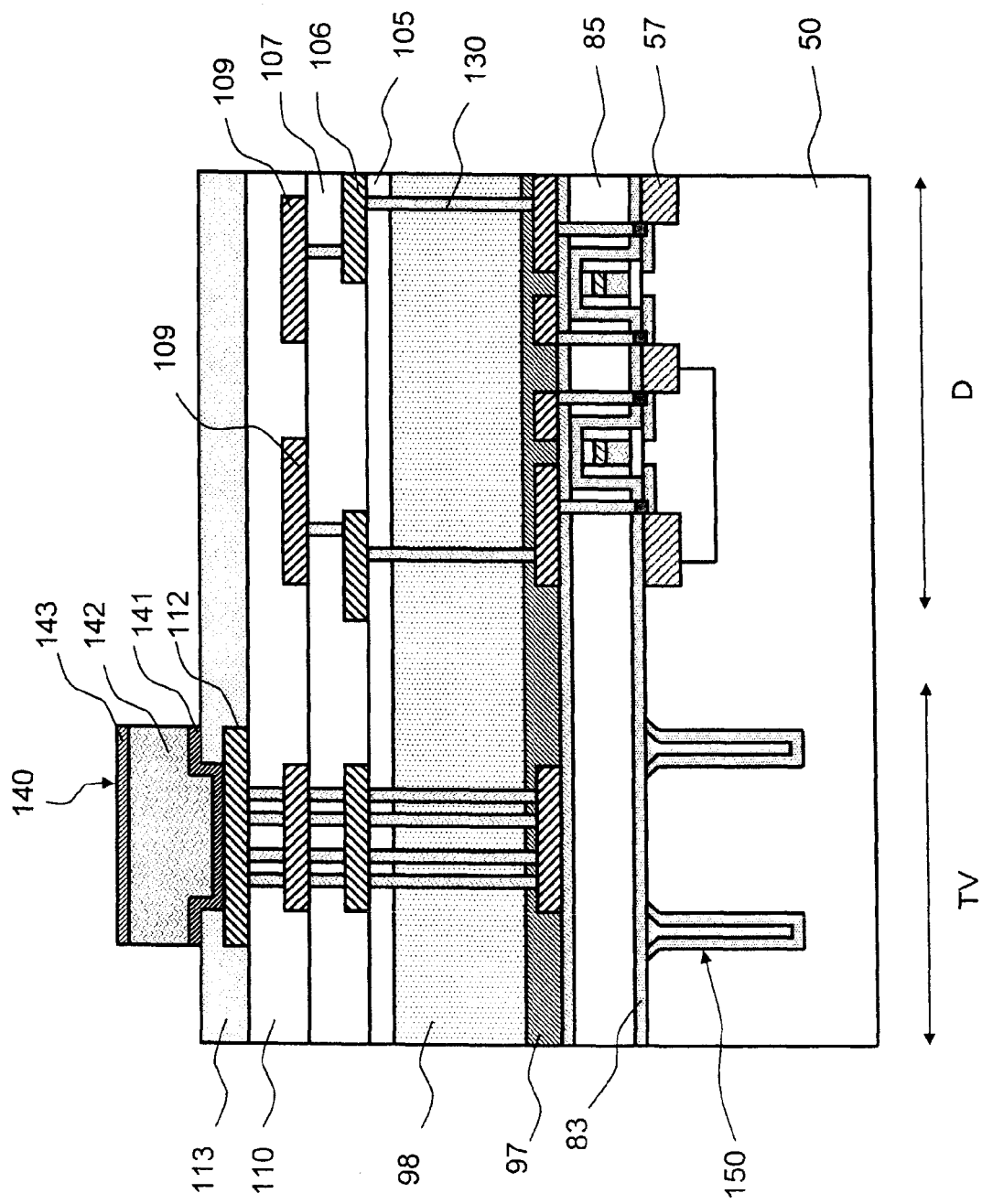

As shown in FIG. 15, the third wiring 112 of the uppermost layer that is disposed in the TSV region TV functions as a pad for forming a topside bump. An opening (hole) is formed in the protective film 113 so as to expose the upper surface of the third wiring 112 and a topside bump 140 that is connected to the third wiring is formed. The topside bump 140 is formed by three layers of a seed film 141 including copper deposited on a titanium (Ti) film, a copper bump 142 and a surface metal film 143. As the surface metal film 143, an alloy film (Sn—Ag film) of tin and silver having a film thickness of about 2 to 4 μm may be exemplified. The copper bump 142 is formed so as to have a height (bump film thickness) of about 10 to 12 μm by an electrolytic plating method.

Figure 16:
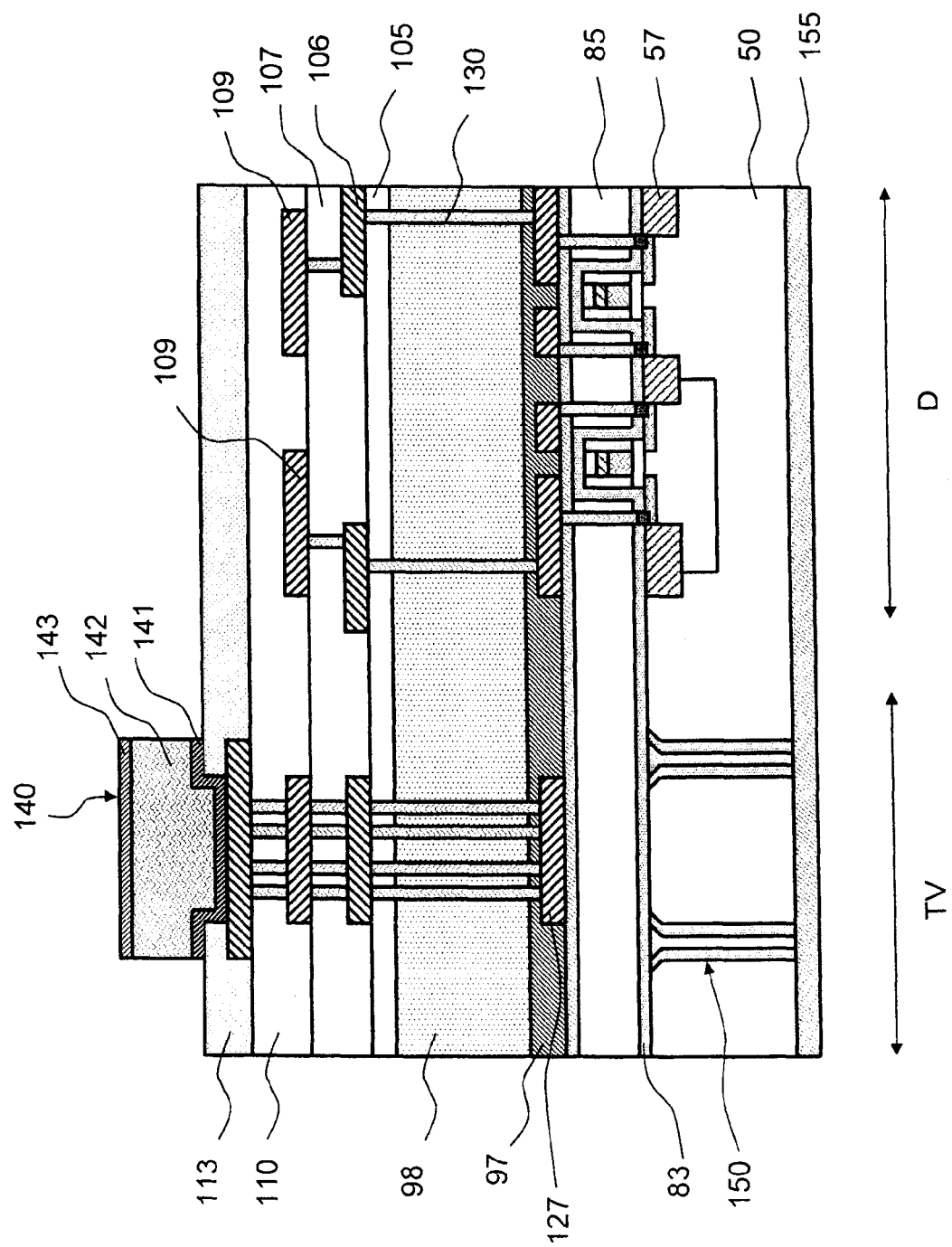

As shown in FIG. 16, a support substrate (not shown) of acrylic resin, quartz and the like is bonded on the surface side (upper surface side in FIG. 16) of the semiconductor substrate 50 via an adhesive layer and the backside (lower surface side in FIG. 16) of the semiconductor substrate 50 is then ground (back grinding) to reduce a film thickness up to a predetermined thickness (for example, 40 μm). By the grinding process, a bottom of the insulation ring 150 that has already been formed is exposed on the backside of the semiconductor substrate 50. A silicon nitride film 155 is formed to have a film thickness of about 200 to 400 nm so as to cover the backside of the semiconductor substrate 50. The silicon nitride film 155 prevents the copper, which is used for the TSV plugs V to be formed in a subsequent process, from diffusing into the semiconductor substrate from the backside thereof during the manufacturing process and thus influencing the device characteristics adversely.

Figure 17:
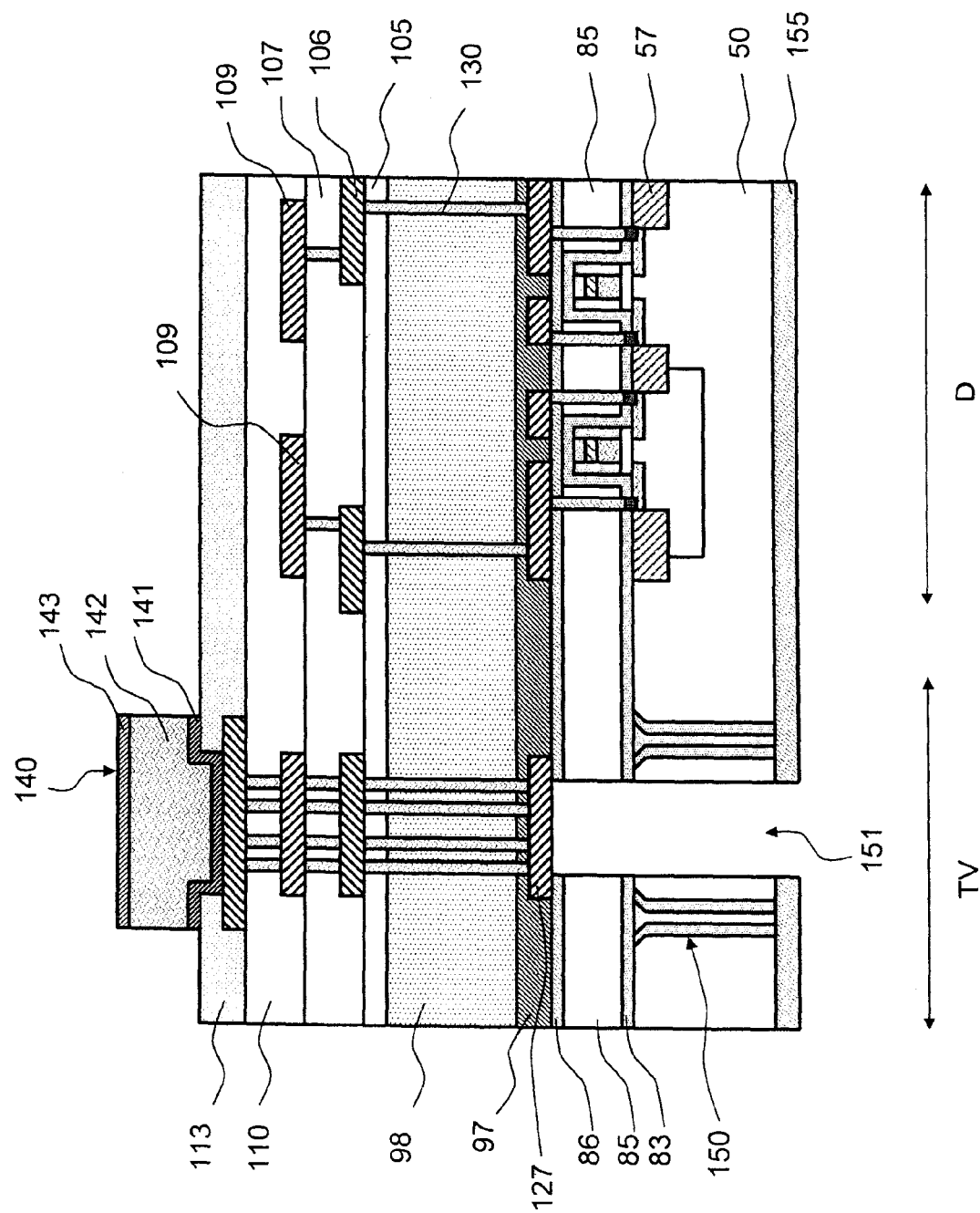

As shown in FIG. 17, an opening (hole) 151 is formed by the anisotropic dry etching so that a backside of the local wiring 127, which is disposed in the TSV region TV, is exposed. The opening 151 is formed to penetrate through the silicon nitride film 155, the semiconductor substrate 50, the liner film 83, the first interlayer insulation film 85 and the second interlayer insulation film 86. At a bottom side (the upper side in FIG. 17) of the opening 151, the backside of the local wiring 127 is exposed. The dry etching of forming the opening 151 may be performed in two steps of the silicon etching of the semiconductor substrate 50 and the insulation film etching of the first interlayer insulation film 85 and the like separately. In addition, regarding the silicon etching of the semiconductor substrate 50, the conventional Bosch process having no tapered portion may be used because a size of the opening is sufficiently large.

Next, as shown in FIG. 1, the backside bump 160 integrated with the through-plug V filling the inside of the opening 151 is formed. The backside bump 160 is made of three layers of a seed film 161 including copper deposited on a titanium (Ti) film, a copper bump 162 and a backside metal film 163. As the backside metal film 163, a deposition film (Au/Ni film) including gold (Au) deposited on nickel (Ni) and having a film thickness of about 2 to 4 μm may be exemplified. The copper bump 162 is formed to fill the inside of the opening 151 via the seed film 161 by the electrolytic plating method and also serves as the through-plug V.

The bump is formed so that a height (bump height) protruding from the backside of the semiconductor substrate 50 is about 8 μm or smaller. The bump is preferably formed so that the exposed surface side (the lower surface in FIG. 1) of the backside bump 160 is smooth. After forming the backside bump 160, the support substrate is removed.

By the above processes, the semiconductor chip including the TSVs 200 including the structure shown in FIG. 1 is completely formed, so that the semiconductor device of this exemplary embodiment is completed.

In addition to the above specific example, the invention can be also used as a method for forming an opening including a tapered portion in a semiconductor substrate when forming a device including a MEMS (Micro Electro Mechanical Systems) structure, such as acceleration sensor. Also, the material for filling the inside of the formed opening is not limited to the insulation film. For example, even when the opening is filled with a conductive film by the CVD, the invention can be applied.

In addition, the substrate in which the opening is to be formed is not limited to the substrate of a silicon single layer. For example, regarding a SOI (Silicon On Insulator) substrate in which a semiconductor layer having a thickness of about 10 to 100 μm is formed on an insulation film, the invention can be used as a method for processing the semiconductor layer.

The opening width and opening depth for the insulation ring that is formed by the invention are not limited with respect of the sizes thereof. However, when the invention is applied for forming an opening having an aspect ratio of 10 or greater, it is possible to realize the great effect from a standpoint of improvement on the embedding characteristic.

In the below, modified embodiments of the first exemplary embodiment will be described.

First Modified Embodiment

This modified embodiment is different from the first exemplary embodiment, in that after the trench for insulation ring 150*c* is formed, an etching process for smoothing the protrusions by the scalloping is further performed. In the below, only the process different from the first exemplary embodiment will be described and the descriptions of the other processes will be omitted.

Figure 23:
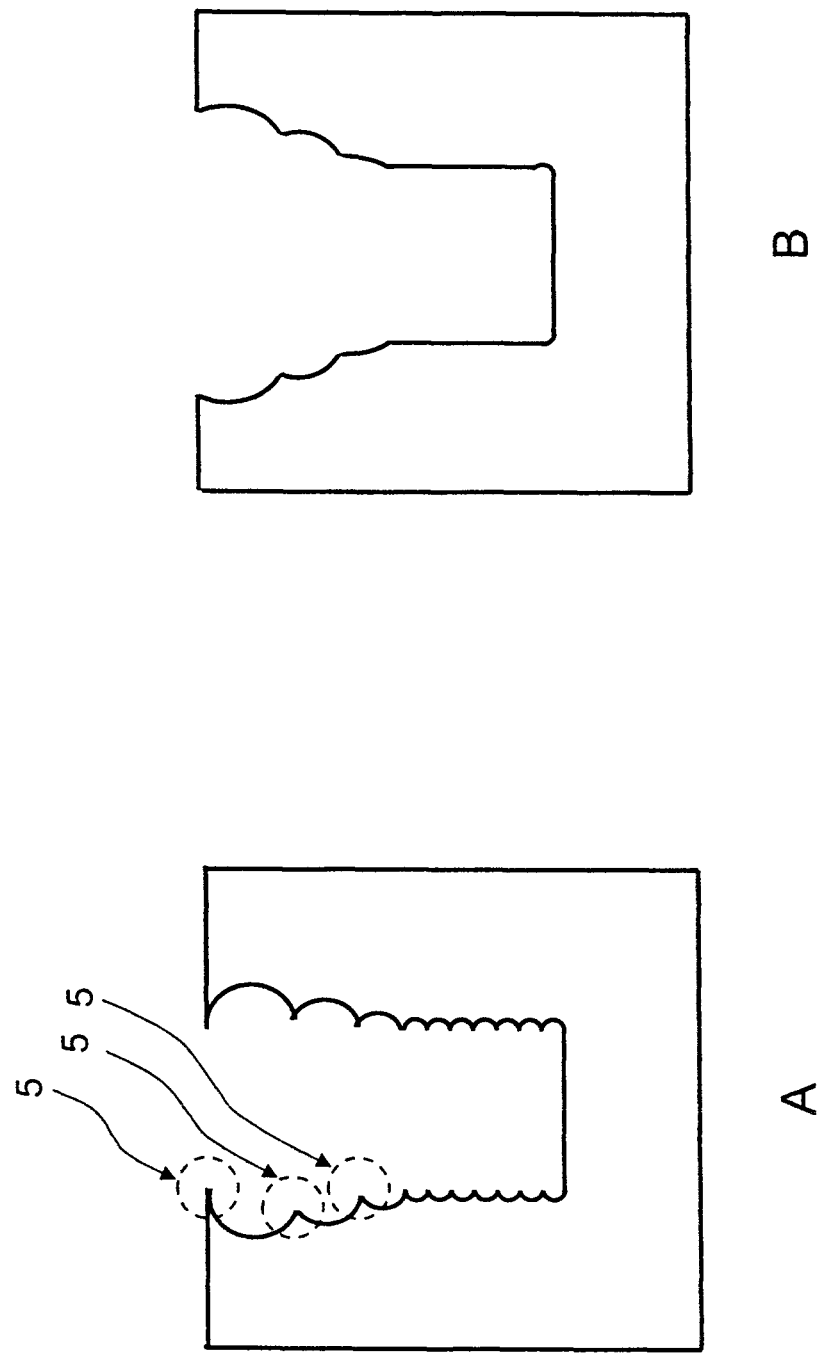
FIGS. 23A and 23B show a first modified embodiment of the first exemplary embodiment.

FIG. 23A is a sectional view after the process of FIG. 8 of the first exemplary embodiment is completed. As shown in FIG. 23A, after the trench for insulation ring 150*c* is formed, protrusions 5 by the scalloping are formed on the inner wall side surface of the trench for insulation ring 150*c*. As shown in FIG. 23B, the protrusions 5 are removed by etching the inner wall of the trench for insulation ring 150*c*.

In this modified embodiment, it is possible to further smooth the tapered portion and the vertical portion, compared to the first exemplary embodiment. As a result, it is possible to prevent the void from being formed in the insulation ring more effectively, compared to the first exemplary embodiment, thereby effectively suppressing the manufacturing yield from being lowered.

Second Modified Embodiment

This modified embodiment is different from the first exemplary embodiment, in that after the trench for insulation ring 150*c* is formed, a process for forming an insulation film on the inner wall side surface of the trench for insulation ring 150*c* and an etching process for etching the inner wall side surface of the trench for insulation ring 150*c* are further performed. In the below, only the process different from the first exemplary embodiment will be described and the descriptions of the other processes will be omitted.

Figure 24:
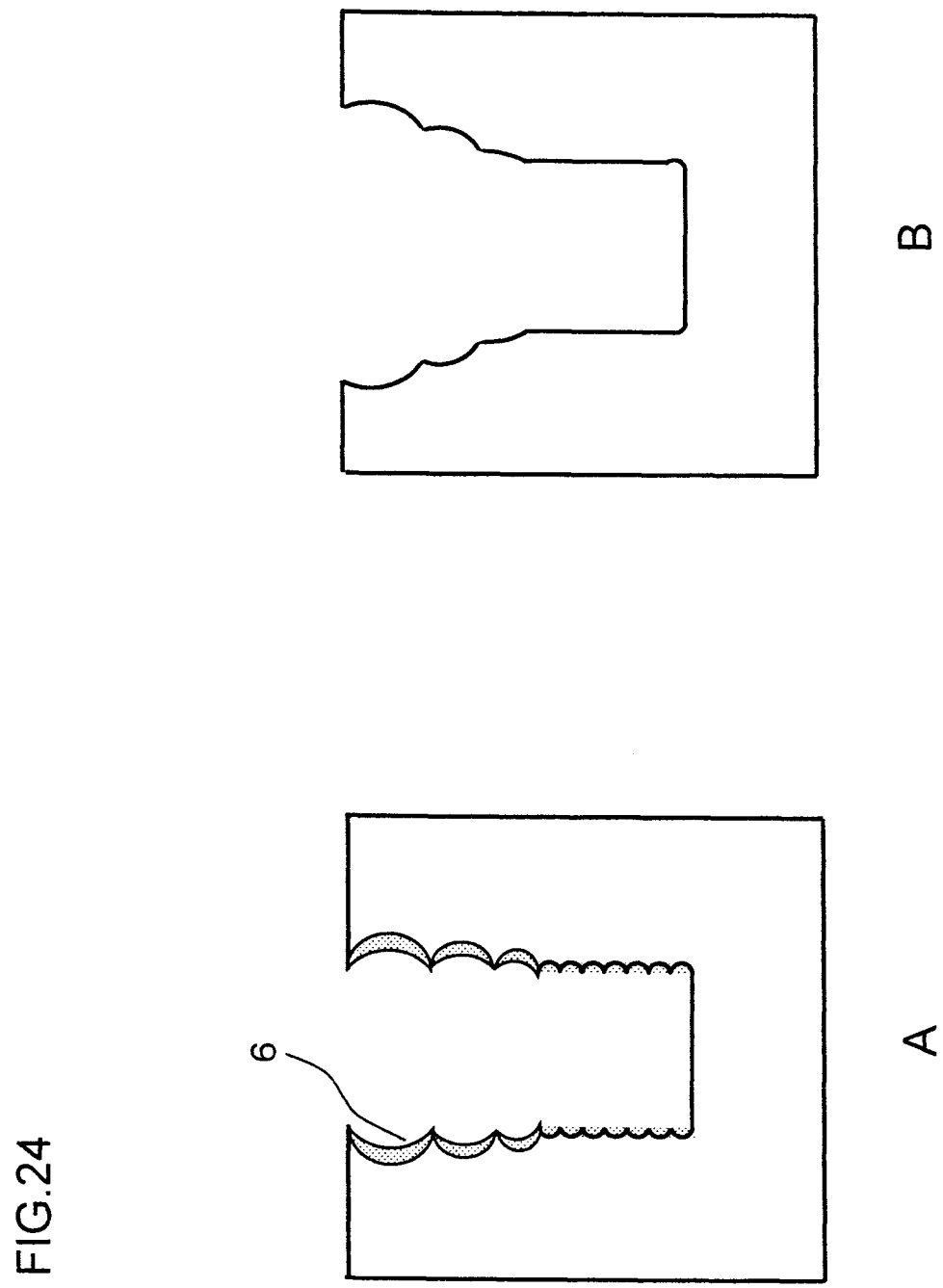
FIGS. 24A and 24B show a second modified embodiment of the first exemplary embodiment.

As shown in FIG. 24A, after the process of FIG. 8 of the first exemplary embodiment is completed, an insulation film is formed on a whole surface and an etch-back process is performed. Thereby, an insulation film 6 is formed on the inner wall side surface of the trench for insulation ring 150*c* in such a degree that a part of the protrusions 5 by the scalloping is exposed. As shown in FIG. 24B, the inner wall side surface of the trench for insulation ring 150*c* are etched. At this time, the protrusions 5 are preferentially removed due to a difference between etching rates of the insulation film 6 and the semiconductor substrate 50. By the etching conditions, the insulation film 6 may be removed or remained. However, it is preferable to remove the insulation film 6 so as to enlarge a diameter of the trench for insulation ring 150c as large as possible.

As the insulation film, TEOS-NSG (Tetraethyl orthosilicate Tetraethoxysilane-None-doped Silicate Glass) may be used. The etching conditions may include conditions that the gas including SF$_6$ and NH$_3$ is used and the high temperature such as 100° C. or higher is set.

In addition, after etching the insulation film, an insulation film may be further formed on the inner wall side surface of the trench for insulation ring 150c for smoothing. Furthermore, considering the series of processes of forming the insulation film on the inner wall side surface of the trench for insulation ring 150c, etching the inner wall side surface of the trench for insulation ring 150c and forming the insulation film on the inner wall side surface of the trench for insulation ring 150c as one cycle, a plurality of the cycles may be performed.

In this modified embodiment, it is possible to further smooth the tapered portion and the vertical portion, compared to the first exemplary embodiment. As a result, it is possible to prevent the void from being formed in the insulation ring more effectively, compared to the first exemplary embodiment, thereby effectively suppressing the manufacturing yield from being lowered.

Second Exemplary Embodiment

Next, an application example of the first exemplary embodiment will be described.

Figure 18:
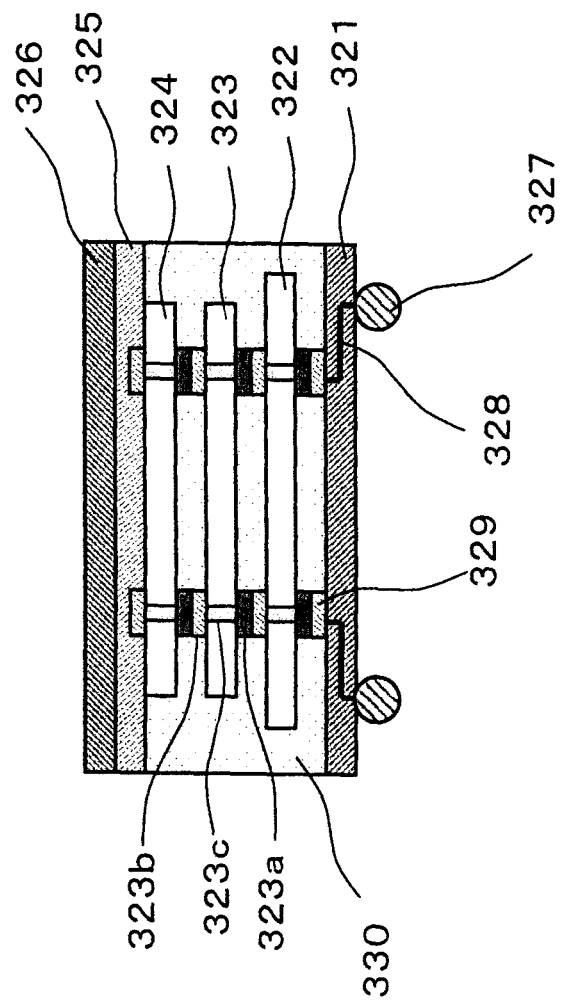
FIGS. 18 and 19 show a semiconductor device of a second exemplary embodiment.

FIG. 18 is a sectional view of a highly integrated package with the stacked two DRAM chips including TSVs, which are formed according to the first exemplary embodiment. Semiconductor chips 323, 324 are core chips of the DRAMs that are formed according to this exemplary embodiment, and includes as a memory cell circuit and a peripheral circuit for data input and output with respect to the memory cell. The specific structure of the TSV is the same as the above structure and thus is not shown in FIG. 18.

The semiconductor chips 323, 324 comprise the TSVs including the same structure. In the below, the semiconductor chip 323 will be described as an example. The semiconductor chip 323 comprises a plurality of TSVs 323c, each of which comprises a backside bump 323a, and a topside bump 323b connected with each other.

The semiconductor chip 322 functions as an interface chip and is made from a logic circuit that controls input and output of data with regard to each of the DRAM core chips 323, 324 and input and output of data to the outside of the package. The interface chip 322 also includes TSVs, which are formed by the above exemplary embodiment, and the same topside and backside bumps as the DRAM core chips 323, 324.

Each of the semiconductor chips is individualized by dicing after forming the TSVs. The semiconductor chips to be stacked have the same arrangement of the TSVs and may have different chip sizes.

The uppermost semiconductor chip 324 comprises a surface that includes the topside bump and is fixed to a metal lead frame 326 by an attaching film 325. By repeating processes of arraigning the TSVs of the three semiconductor chips with each other and temporarily fixing the TSVs with each other by low-temperature (about 150 to 170° C.) heating, the three semiconductor chips are sequentially stacked. At this time, by primarily fixing the uppermost semiconductor chip 324 and the lead frame 326, it can be used as a basis when stacking the respective chips. After all the semiconductor chips are stacked, the respective semiconductor chips are completely fixed by applying the temperature of about 250 to 300° C. under the constant pressure.

A reference numeral 321 indicates a base substrate. The base substrate 321 and the lowermost semiconductor chip 322 are connected via terminals 329. A resin 330 is filled between the semiconductor chips, thereby protecting the respective semiconductor chips. The base substrate 321 has a plurality of soldered balls 327 and is connected to the TSVs of the interface chip 322 via a wiring layer 328 and the terminals 329. The soldered balls 327 are applied with input and output signals from the outside, a power supply voltage and the like. In the meantime, three or more semiconductor chips may be stacked.

Figure 19:
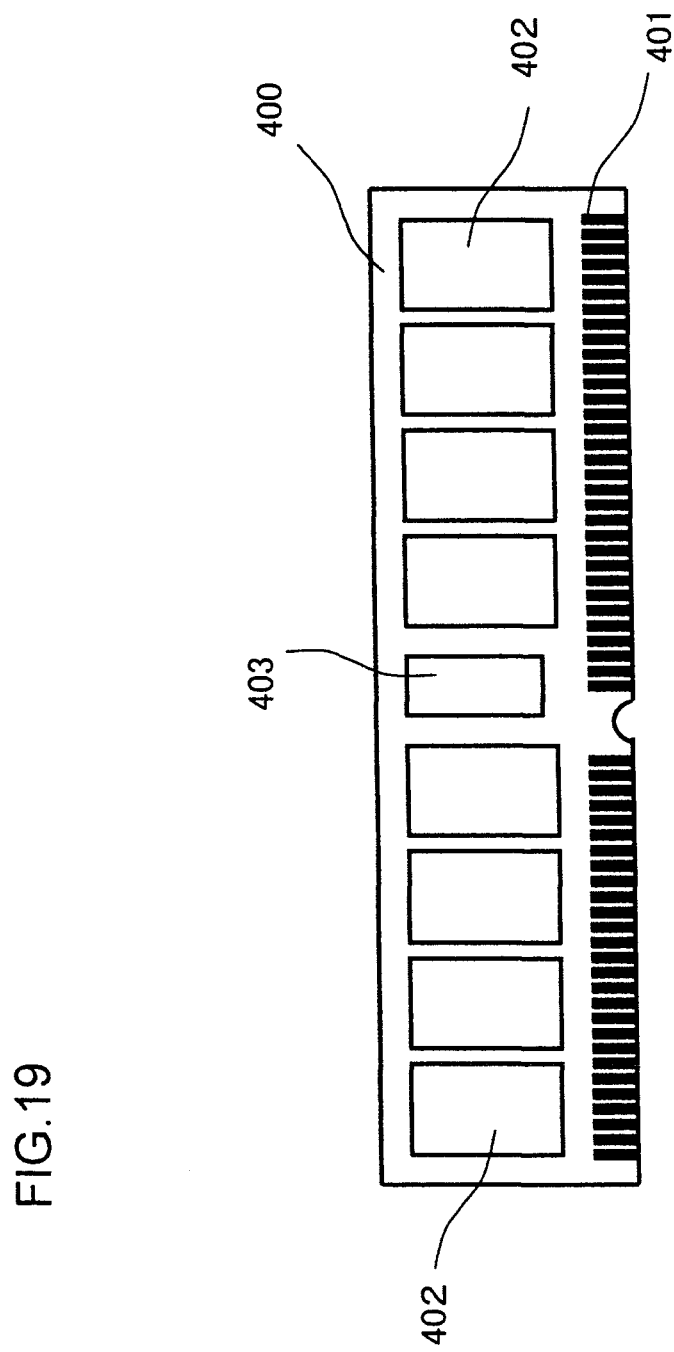

FIG. 19 is a pictorial view showing a memory module including DRAM packages manufactured as described above. A reference numeral 402 indicates a DRAM package that is manufactured as shown in FIG. 18 and is mounted on a printed substrate 400. The printed substrate 400 comprises a plurality of input/output terminals (I/O terminals) 401 for electrically connecting the memory module to an external device. The data is input and output to and from the respective DRAM packages 402 via the I/O terminals 401.

The memory module comprises a control chip 403 that controls the input/output of the data to and from the respective DRAM packages. The control chip 403 performs timing adjustment of a clock signal that is input from the outside of the memory module, shaping of a signal waveform and the like, thereby supplying the same to the respective DRAM packages. In the meantime, only the plurality of DRAM packages may be mounted without arranging the control chip 403 on the printed substrate 400.

By using this exemplary embodiment, it is possible to easily manufacture a DRAM chip with high integration corresponding to the miniaturization, thereby making it possible to form a memory module corresponding to data storage of large capacity. By using the above memory module including the DRAM chips formed by this exemplary embodiment, it is possible to form a data processing device that will be described in the below.

Third Exemplary Embodiment

Figure 20:
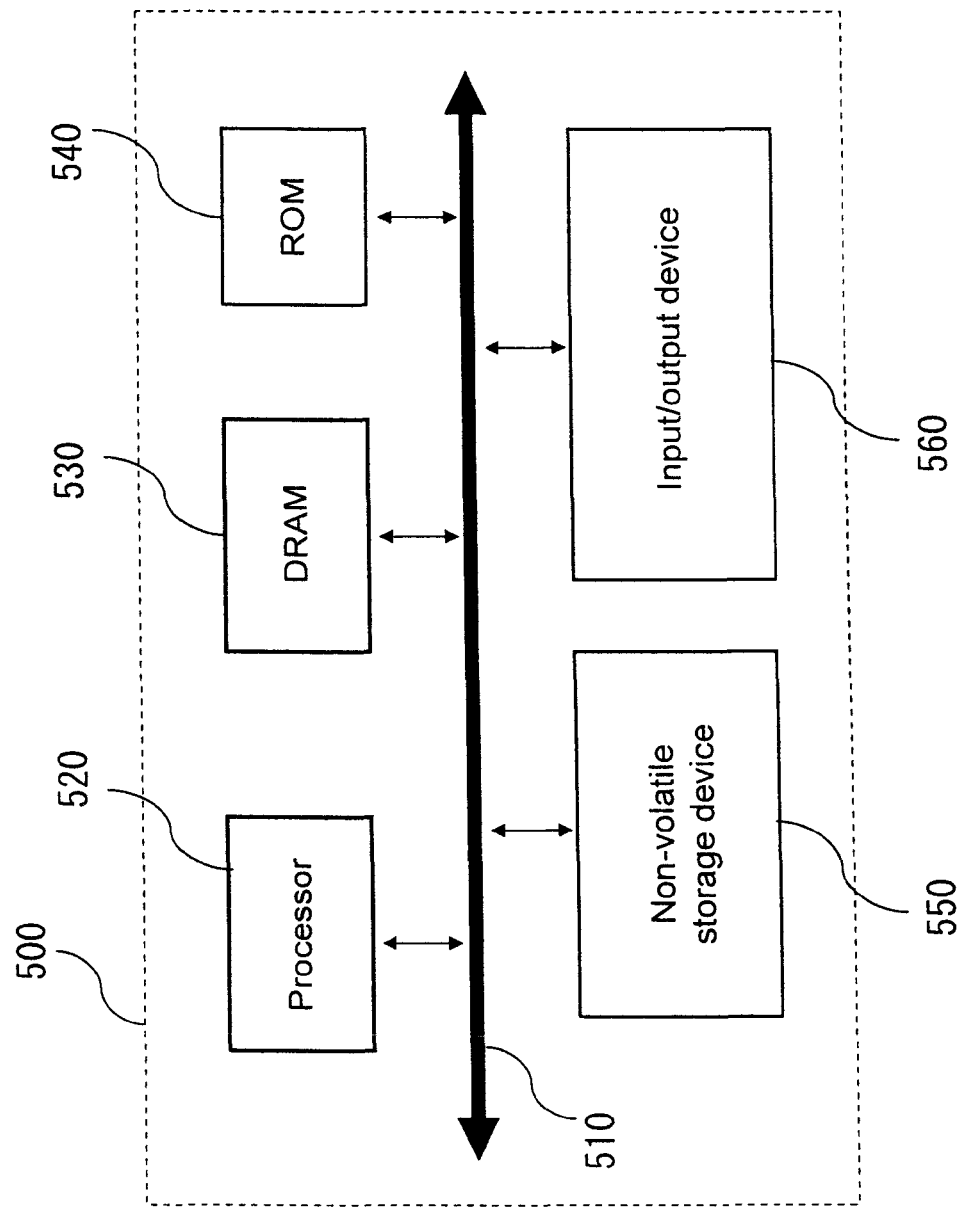
FIG. 20 shows a semiconductor device of a third exemplary embodiment.

FIG. 20 schematically shows a configuration of a data processing device 500 according to this exemplary embodiment. The data processing device 500 includes a calculation processing device (processor) 520 and a DRAM memory module 530, which are connected to each other via a system bus 510. The processor 520 may be a micro processing unit (MPU), a digital signal processor (DSP) and the like. The DRAM memory module 530 comprises a DRAM chip that is formed according to this exemplary embodiment. In addition, a read only memory (ROM) 540 for storing fixed data may be connected to the system bus 510.

Although only one system bus 1 is shown for simplification, a plurality of system buses may be connected serially or in parallel through a connector and the like, as required. In addition, the respective devices may be connected to each other by a local bus, rather than the system bus 510.

Also, in the data processing device 500, a non-volatile storage device 550 and an input/output device 560 are connected to the system bus 510, as required. As the non-volatile bus, a hard disk drive, an optical drive, a solid state drive (SSD) and the like may be used as the non-volatile storage device. The input/output device 560 includes a display device such as liquid crystal display and a data input device such as keyboard, for example.

Figure 21:
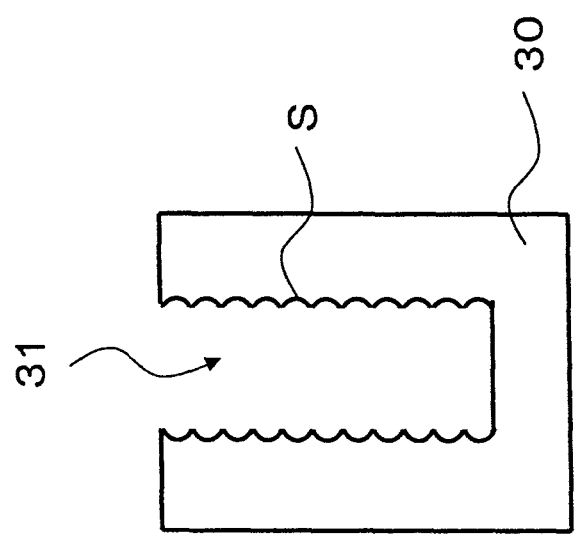
FIGS. 21 and 22A, 22B, 22C, and 22D show a method of manufacturing a semiconductor device of the related art.
Figure 22:
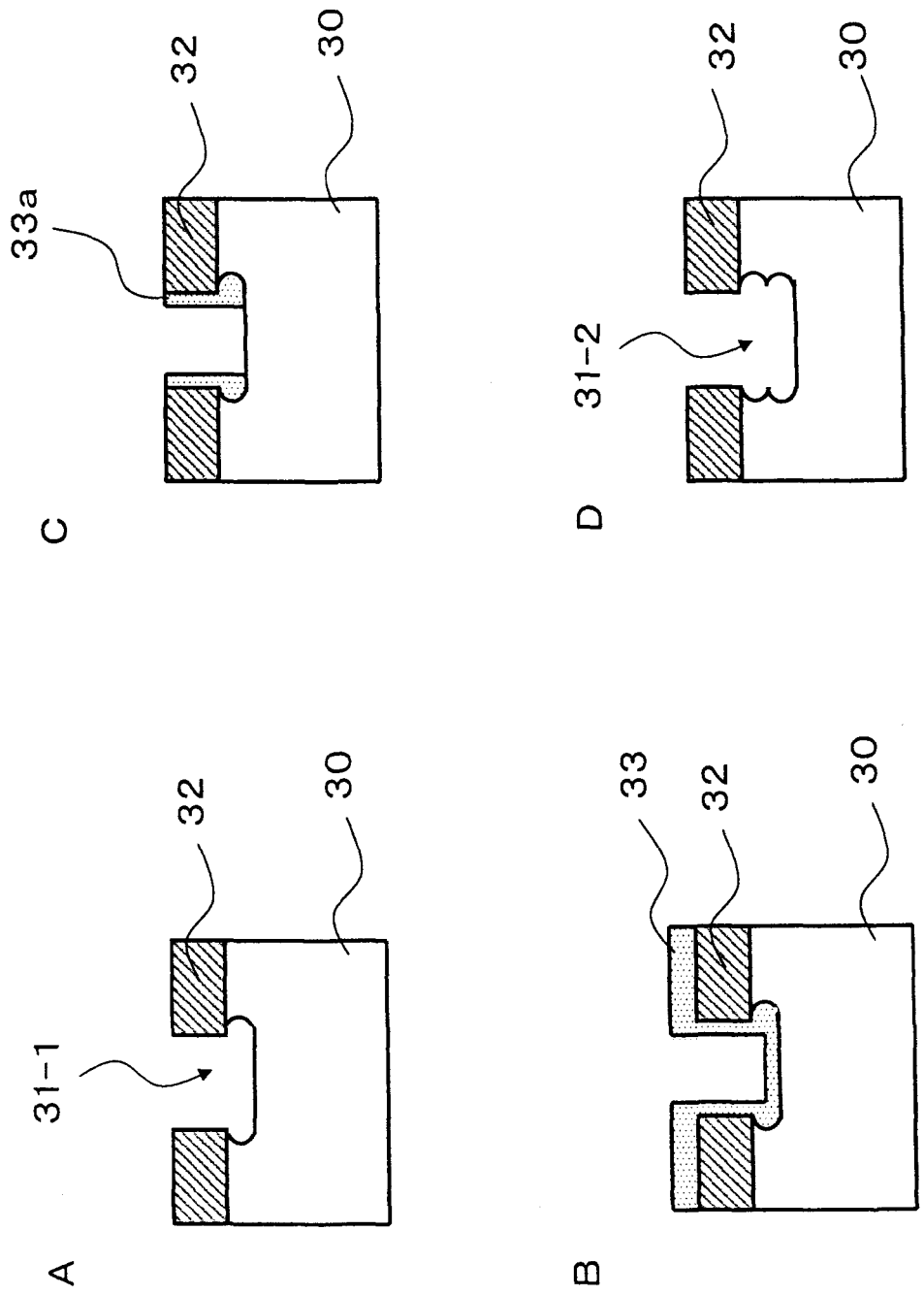

In FIG. 21, the number of each constitutional element of the data processing device 500 is one for simplification. However, the invention is not limited thereto and one or more of each constitutional element may be provided in plural. The data processing device 500 includes a computer system, for example. However, the invention is not limited thereto.

By using this exemplary embodiment, it is possible to easily manufacture a DRAM chip with high integration corresponding to the miniaturization, thereby making it possible to form a data processing device having high performance.

It is apparent that the present invention is not limited to the above embodiments, but may be modified and changed without departing from the scope and spirit of the invention.

In addition, while not specifically claimed in the claim section, the applications reserve the right to include in the claim section at any appropriate time the following semiconductor device and method:

1. A method of manufacturing a semiconductor device, comprising:
   forming a first opening in a semiconductor substrate, the first opening including inner wall side surface with a tapered shape and including a sectional area that is gradually decreased from a first surface of the semiconductor substrate toward a thickness direction thereof; and
   forming a second opening including a sectional area that is constant from a bottom surface of the first opening toward the thickness direction of the semiconductor substrate.
2. The method according to the above 1,
   wherein in forming the first opening, a cycle containing the following steps (1)-(3) is repeated a plurality of times, and a sectional area of a third opening formed by step (1) is decreased every one cycle.
   (1) etching the semiconductor substrate to form a third opening;
   (2) forming a protective film on an inner wall of the third opening; and
   (3) removing the protective film formed on a bottom surface of the inner wall of the third opening.
3. The method according to the above 2,
   wherein an etching time of the step(1) is shortened every one cycle.
4. The method according to the above 1,
   wherein in forming the second opening, a cycle containing the following steps (A)-(C) is repeated a plurality of times, and a sectional area of a fourth opening formed by step (A) of each cycle is the same.
   (A) etching the semiconductor substrate to form a fourth opening;
   (B) forming a protective film on an inner wall of the fourth opening; and
   (C) removing the protective film formed on a bottom surface of the inner wall of the fourth opening.
5. The method according to the above 1, further comprising:
   etching inner wall side surfaces of the first and second openings to smooth the inner wall side surfaces of the first and second openings, after forming the second opening.
6. The method according to the above 1, after forming the second opening, further comprising:
   forming an insulation film on the inner wall side surfaces of the first and second openings; and,
   etching the inner wall side surfaces of the first and second openings including the insulation film formed thereon to smooth the inner wall side surfaces of the first and second openings.

7. A semiconductor device, comprising:
   a first film;
   one or more openings for a tapered portion formed from a surface of the first film toward an inside of the first film; and
   two or more openings for a vertical portion formed below the opening for the tapered portion in the first film,
   wherein the opening for the tapered portion has a sectional area $S_{(n)}$ (n: an integer of 1 or greater) of a section perpendicular to a thickness direction of the first film, the $S_{(n)}$ being changed in the thickness direction and having a maximum value $S_{(n)max}$ (n: an integer of 1 or greater) of the $S_{(n)}$,
   wherein the openings for the vertical portion have a sectional area $S'_{(a)}$ (a: an integer of 1 or greater) of a section perpendicular to the thickness direction of the first film, the $S'_{(a)}$ being changed in the thickness direction, and a maximum value $S'_{(a)max}$ (a: an integer of 1 or greater) of the $S'_{(a)}$ of each opening for the vertical portion is a constant value, and
   wherein $S'_{(a)max}$ is smaller than any $S_{(n)max}$.
8. The semiconductor device according to the above 7,
   wherein the semiconductor device comprises two or more openings for the tapered portion,
   the $S_{(n)max}$ of each opening for the tapered portion is gradually decreased from the surface of the first film toward the thickness direction thereof, and
   the $S_{(n)max}$ of the lowermost opening for the tapered portion farthest from the surface of the first film in the thickness direction thereof, is greater than the $S'_{(a)max}$.
9. The semiconductor device according to the above 7,
   wherein the first film includes an electrode formed so as to penetrate through the first film in a thickness direction,
   the opening for the tapered portion and the openings for the vertical portion communicating with each other penetrate through the first film in the thickness direction thereof,
   an insulation film is embedded in the opening for the tapered portion and the openings for the vertical portion,
   the insulation film embedded in the opening for the tapered portion and the openings for the vertical portion is an insulation ring, and
   the insulation ring is formed so as to penetrate through the first film and so as to surround an outer side surface of the electrode.
10. A data processing device including a plurality of the semiconductor devices according to the above 9,
    wherein each semiconductor device is connected to each other via the electrodes,
    the data processing device further comprises a calculation processing device, and
    the calculation processing device is connected to each semiconductor device via a system bus.
11. The data processing device according to the above 10,
    wherein each semiconductor device is a semiconductor chip that can perform a storage operation as a DRAM.

The invention claimed is:
1. A semiconductor device, comprising:
   a semiconductor substrate with a first main surface and an opposite, second main surface; and
   a hole penetrating the semiconductor substrate through the first and second main surfaces, the hole including a tapered portion contacting with the first main surface and a vertical portion contacting with the tapered portion and the second main surface, the tapered portion comprising at least first and second scallop openings in that order from the first main surface toward the vertical portion, each of the first and second scallop openings including a first end close to the first main surface and a second end close to the second main surface, the first and second scallop openings respectively including first and second convex side surface, the convex side surface being defined such that a diameter of the hole at the second end of each of the first and second scallop openings is smaller than a diameter of the hole at an intermediate point between the first and second ends of the respective first and second scallop openings, the second end of the first scallop opening contacting with the first end of the second scallop opening, and a first diameter of the hole at the second end of the first scallop opening being larger than a second diameter of the hole at the second end of the second scallop opening, the vertical portion comprising a plurality of scallop openings arranged in series, the plurality of scallop openings each including a convex side surface.

2. The semiconductor device as claimed in claim 1, the semiconductor device further comprising:
an insulating film covering a surface exposed by the hole of the semiconductor substrate; and
a conductive via provided in the hole through the insulating film,
wherein a plurality of third diameters of the hole at respective connecting points of two scallop openings adjacently arranged among the plurality of scallop openings are substantially the same as one another and smaller than the second diameter.

3. The semiconductor device as claimed in claim 1, wherein the first scallop opening has a first depth in a direction perpendicular to a surface of the semiconductor substrate, and the second scallop opening has a second depth smaller than the first depth in the direction.

4. The semiconductor device as claimed in claim 3, wherein the plurality of scallop openings each has a third depth smaller than the second depth in the direction.

5. The semiconductor device as claimed in claim 1, wherein the first end of the first scallop opening contacts with the first main surface.

6. The semiconductor device as claimed in claim 1, wherein the first and second scallop openings have a smoothed shape at a region where the second end of the first scallop opening contacts with the first end of the second scallop opening.

7. The semiconductor device as claimed in claim 1, the semiconductor device further comprising:
a transistor provided on the first surface of the semiconductor substrate; and
an interlayer insulating film formed on the first substrate and covering the transistor, the interlayer insulating film including a second hole penetrating therethrough and aligned with the hole provided in the semiconductor substrate,
wherein the conducive via is provided in the second hole.

8. The semiconductor device as claimed in claim 7, the semiconductor device further comprising:
a seed layer provided between the conductive via and the interlayer insulating film in the second hole and between the conductive via and the insulating film in the hole provided in the semiconductor substrate.

9. The semiconductor device as claimed in claim 7, the semiconductor device further comprising:
a bump provided over the second surface of the semiconductor substrate, the bump and the conductive via being molded as one piece.

10. The semiconductor device as claimed in claim 7, the semiconductor device further comprising:
a second interlayer insulating film formed over the interlayer insulating film;
a plurality of contact plugs penetrating the second interlayer insulating film and electrically connected to the conductive via; and
a conductive bump provided over the second interlayer insulating film and electrically connected to the plurality of contact plugs.

11. A semiconductor device, comprising:
a plurality of memory chips each including a memory cell and a peripheral circuit to communicate a data with the memory cell;
each of the memory chips comprising:
a semiconductor substrate including a first main surface and a second main surface opposing the first main surface; and
a hole penetrating in the semiconductor substrate through the first and second main surfaces, and including a tapered portion contacting with the first main surface and a vertical portion contacting with the tapered portion and the second main surface,
an insulating film covering a surface of the semiconductor substrate exposed by the hole; and
a conductive via provided in the hole through the insulating film, the tapered portion comprising at least first and second scallop openings in that order from the first main surface toward the vertical portion, each of the first and second scallop openings including a first end close to the first main surface and a second end close to the second main surface,
the first and second scallop openings respectively including first and second convex side surface, the convex side surface being defined such that a diameter of the hole at the second end of each of the first and second scallop openings is smaller than a diameter of the hole at an intermediate point between the first and second ends of the respective first and second scallop openings,
the first end of the first scallop opening contacting with the first main surface, the second end of the first scallop opening contacting with the first end of the second scallop opening,
a first diameter of the hole at the second end of the first scallop opening being larger than a second diameter of the hole at the second end of the second scallop opening, the vertical portion comprising a plurality of scallop openings arranged in series, the plurality of scallop openings each including a convex side surface,
wherein the plurality of memory chips are connected to one another through the respective conductive via.

12. The semiconductor device as claimed in claim 11, wherein,
a plurality of third diameters of the hole at respective connecting points of two scallop openings adjacently arranged among the plurality of scallop openings being substantially the same as one another and smaller than the second diameter, and
the first scallop opening has a first depth in a direction perpendicular to a surface of the semiconductor substrate, and the second scallop opening has a second depth smaller than the first depth in the direction.

13. The semiconductor device as claimed in claim 12, wherein the plurality of scallop openings each has a third depth smaller than the second depth in the direction.

14. The semiconductor device as claimed in claim 13, wherein the first and second scallop openings have a smoothed shape at a region where the second end of the first scallop opening contacts with the first end of the second scallop opening.

15. The semiconductor device as claimed in claim 11, the semiconductor device further comprising:
   a transistor provided on the first surface of the semiconductor substrate.

16. The semiconductor device as claimed in claim 13, wherein the tapered portion further comprises a third scallop opening so that the first, second and third scallop openings are arranged in that order from the first main surface toward the vertical portion, the third scallop opening including a first end close to the first main surface and a second end close to the second main surface,
   wherein the third scallop opening includes a third convex side surface,
   wherein the second end of the second scallop opening contacts with the first end of the third scallop opening, and
   wherein a fourth diameter of the hole at the second end of the third scallop openings is smaller than the second diameter and larger than the third diameter.

17. The semiconductor device as claimed in claim 16, wherein the third scallop opening has a fourth depth smaller than the second depth and larger than the third depth in the direction.

* * * * *